(12) United States Patent
Naganuma et al.

(10) Patent No.: US 9,067,356 B2
(45) Date of Patent: Jun. 30, 2015

(54) METHOD FOR PRODUCING FINE CONVEX PATTERN STRUCTURE AND FINE CONVEX PATTERN PRODUCTION SYSTEM

(71) Applicant: DAI NIPPON PRINTING CO., LTD., Tokyo (JP)

(72) Inventors: Hiroyuki Naganuma, Tokyo (JP); Yuki Aritsuka, Tokyo (JP); Mikio Ishikawa, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/357,938

(22) PCT Filed: Aug. 8, 2013

(86) PCT No.: PCT/JP2013/071477
§ 371 (c)(1),
(2) Date: May 13, 2014

(87) PCT Pub. No.: WO2014/024958
PCT Pub. Date: Feb. 13, 2014

(65) Prior Publication Data
US 2014/0327188 A1 Nov. 6, 2014

(30) Foreign Application Priority Data

Aug. 9, 2012 (JP) .................................. 2012-176940

(51) Int. Cl.
*B29C 59/02* (2006.01)
*G03F 7/00* (2006.01)
*B82Y 10/00* (2011.01)
*B82Y 40/00* (2011.01)

(52) U.S. Cl.
CPC .............. *B29C 59/02* (2013.01); *G03F 7/0002* (2013.01); *B82Y 10/00* (2013.01); *B82Y 40/00* (2013.01); *B29C 2791/00* (2013.01)

(58) Field of Classification Search
CPC ............ B29C 59/022; B29C 2059/023; G03F 7/0002
See application file for complete search history.

(56) References Cited

U.S. PATENT DOCUMENTS

| 5,772,905 | A | 6/1998 | Chou | |
|---|---|---|---|---|
| 2005/0270516 | A1* | 12/2005 | Cherala et al. | 355/72 |
| 2008/0305440 | A1* | 12/2008 | Willson et al. | 430/322 |
| 2013/0093113 | A1* | 4/2013 | Hayashi et al. | 264/40.1 |

FOREIGN PATENT DOCUMENTS

JP A-2007-296683 11/2007

* cited by examiner

*Primary Examiner* — James Sanders
(74) *Attorney, Agent, or Firm* — Oliff PLC

(57) ABSTRACT

A method for producing a fine convex pattern structure having a fine convex pattern projecting from a flat portion in a predetermined direction with respect to the flat portion includes: using an imprint mold that has a fine concave pattern corresponding to the fine convex pattern and forming the fine convex pattern projecting from the flat portion under a condition in which the fine convex pattern is inclined to the flat portion side from the predetermined direction; and causing the fine convex pattern to project in the predetermined direction with respect to the flat portion by inducing electric charges at least on the inclined fine convex pattern.

14 Claims, 11 Drawing Sheets

METHOD FOR PRODUCING FINE CONVEX PATTERN STRUCTURE AND FINE CONVEX PATTERN PRODUCTION SYSTEM

TECHNICAL FIELD

The present invention relates to a method for producing a fine convex pattern structure and a system for producing a fine convex pattern structure, and more particularly to a method and system for producing a fine convex pattern structure by using a nanoimprinting technique.

BACKGROUND ART

The nanoimprinting technique has recently attracted attention as a microprocessing technique. The nanoimprinting technique is a pattern forming technique that uses a mold member (mold) obtained by forming a fine concave and convex pattern on the surface of a base material and that performs equivalent transferring of the fine concave and convex pattern by transferring the fine concave and convex pattern to the material to be processed (Patent Document 1).

In such nanoimprinting technique, a mold is typically pressed against a fluidity resin, the resin is cured in this state, and the mold is then separated from the cured resin, thereby forming a fine concave and convex pattern structure having a fine concave and convex pattern. The fine concave and convex pattern structure having a fine concave and convex pattern (for example, a pillar-shaped or a line-and-space-shaped resin pattern) that is thus formed is directly used as a nano-pillar array structure such as a cell culturing film, a moth eye film, a micro-needle array, and a polarization film, or as an etching mask for forming a fine concave pattern on a substrate by etching. Therefore, in such a resin pattern, the fine convex pattern is required to be provided in a protruding condition substantially perpendicular to the resin pattern surface.

However, when the mold and the cured resin are separated in the nanoimprinting process, an in-plane force (tensile force), rather than only the force (tensile force) perpendicular to the resin pattern surface, is also applied to the fine convex pattern. As a result the fine convex pattern can tumble. For example, in a case where a mold or a resin as a transfer object is constituted by a material exhibiting flexibility or in a case where a fine convex pattern is formed on a long transfer object material by pressing a rotating mold, which is formed with a fine concave pattern on the surface of a belt imprint mold or a roller, against the long transfer object material, which is delivered in a predetermined direction, a force applied to the fine convex pattern in the in-plane direction becomes great, whereby the degree of inclination of the fine convex pattern becomes too great.

When such tumbling of the fine convex pattern occurs, the desired product cannot be obtained and the production yield is decreased. Since a demand arose for additional size reduction and increase in aspect ratio of convex patterns in the field of the above-described fine processing technical fields, the problem of the tumbling fine convex pattern gained particular importance.

Accordingly, a technique has been suggested by which when a fine convex pattern of a predetermined shape (linear shape, cross-like shape, and the like) is to be formed by nanoimprinting, the direction (separation direction) in which the imprint mold is separated from the cured resin is controlled according to the configuration (shape and the like) of the fine convex pattern, thereby preventing the fine convex pattern from tumbling (defects such as curving)(see Patent Document 2 and the like).

PRIOR ART LIST

Patent Documents

Patent Document 1: U.S. Pat. No. 5,772,905
Patent Document 2: Japanese Patent Application Publication No. 2007-296683

SUMMARY OF THE INVENTION

Problems to be Resolved by the Invention

However, a problem associated with the invention described in Patent Document 2 is that since the fine convex pattern can be prevented from tumbling by controlling the separation operation of the imprint mold, equipment (imprint device or the like) that can realize such a separation operation is needed. Further, a problem remaining even when such equipment is used, is that it is possible to produce only a fine convex pattern structure having a fine convex pattern of a configuration (linear shape, cross-like shape, or the like) such that the tumbling can be prevented by the separation operation, and such a technique is not suitable for producing fine convex pattern structures having other configurations (shape or the like). Thus, a problem associated with the invention described in Patent Document 2 is that this invention has limited applicability.

Yet another problem is that where the imprint mold is separated in a manner such as to avoid, as best as possible, the application of a force in an in-plane direction in order to prevent the fine convex pattern from tumbling, the probability of a defect, such as cracks, occurring in the fine convex pattern when the imprint mold is separated is increased, the degree of probability depending on the strength of the resin material constituting the fine convex pattern and the configuration (shape) of the fine convex pattern.

Further, a problem associated with a recently created demand for additional reduction in size and increase in aspect ratio of fine convex patterns formed by nanoimprinting is that even if the imprint mold is separated in a manner such as to prevent the tumbling of the fine convex pattern that can meet such a demand, the fine convex pattern still tumbles. Thus, it is very difficult to form a fine convex pattern that can meet the demand for additional reduction in size and increase in aspect ratio by using nanoimprinting, without causing the fine convex pattern to tumble or creating defects therein.

In view of the above-described problems, it is an object of the present invention to provide a method for producing with a good accuracy by nanoimprinting a fine convex pattern structure having a fine convex pattern projecting in a predetermined direction, without placing any limitation on the configuration (shape or the like) of the fine convex pattern, and also to provide a system for producing such fine convex pattern structure.

Means of Solving the Problems

As described hereinabove, a fine convex pattern structure formed by nanoimprinting is used, as is, as a final product or used as an etching mask for etching a predetermined base material. Therefore, the fine convex pattern is required to be arranged vertically in the direction substantially perpendicular to the flat portion. This is one more reason why the fine convex pattern should be formed so as not to be inclined. However, where the fine convex pattern is inclined after the transfer step using an imprint mold, but this inclined fine convex pattern can still be arranged vertically in the direction substantially perpendicular to the flat portion, a fine convex pattern structure can be produced by nanoimprinting, without paying much attention to the inclination of the fine convex pattern. The inventors have conducted a comprehensive study aimed at the resolution of the above-described problems on the basis of such an approach. The results obtained demonstrated that the inclined fine convex pattern can be arranged vertically in the direction substantially perpendicular to the flat portion by causing a predetermined force to act upon the fine convex pattern. This finding led to the creation of the present invention.

Thus, the present invention provides a method for producing a fine convex pattern structure having a flat portion and a fine convex pattern projecting from the flat portion in a predetermined direction with respect to the flat portion, the method including: using an imprint mold that has a fine concave pattern corresponding to the fine convex pattern, and forming the fine convex pattern projecting from the flat portion under a condition in which the fine convex pattern is inclined to the flat portion side from the predetermined direction; and causing the fine convex pattern to project in the predetermined direction with respect to the flat portion by inducing electric charges at least on the inclined fine convex pattern (invention 1).

By forming the fine convex pattern under a condition in which the fine convex pattern is inclined to the flat portion side from the predetermined direction with respect to the flat portion, as in the abovementioned invention (invention 1), it is possible to reduce the stresses acting on the fine convex pattern when the imprint mold is separated. Therefore, the separation of the imprint mold can be facilitated and the occurrence of defects such as cracks in the fine convex pattern can be inhibited. Where the fine convex pattern is so formed, the fine convex pattern can be inclined to the flat portion side from the predetermined direction, but by inducing electric charges on the inclined fine convex pattern, it is possible to use an electric repulsion force and cause the fine convex pattern to project in the predetermined direction with respect to the flat portion. Therefore, in accordance with the abovementioned invention (invention 1), a fine convex pattern structure having a fine convex pattern projecting in the predetermined direction with respect to the flat portion can be produced with a good accuracy by the nanoimprinting technique.

Further, for example, when a fine convex pattern structure having a plurality of linear fine convex patterns is produced, the contact state on the contact surface of the imprint mold and each of the plurality of linear fine convex patterns can differ among the patterns. Therefore, when the imprint mold is separated along the line direction of the fine convex patterns, the portions where the separation of the imprint mold and the linear fine convex patterns is started can differ in the easiness of separation. Further, when the imprint mold is separated along the line direction of the fine convex patterns, the fine convex patterns are difficult to incline. As a result, a state is realized in which the stresses applied in the in-plane direction to the fine convex patterns are difficult to relieve. For this reason, defects such as cracks can occur in linear fine convex patterns in the portions where the separation is started, and the linear fine convex patterns can have uneven length in the longitudinal direction. Meanwhile, where the imprint mold is separated in the direction crossing (substantially perpendicular) to the line direction, the stresses applied to the fine convex pattern in the in-plane direction can be easily relieved by inclining the fine convex pattern. Therefore, the uniformity of the longitudinal length of the formed linear fine convex patterns can be increased. In this case, however, the linear fine convex patterns are inclined along the separation direction of the imprint mold. Thus, where the fine convex pattern is formed to be inclined from the predetermined direction to the flat portion side, the dimensional accuracy of the fine convex pattern sometimes can be increased. In accordance with the above-described invention (invention 1), however, electric charges are induced in the inclined fine convex pattern, thereby making it possible to use an electric repulsion force and cause the fine convex pattern to project in the predetermined direction with respect to the flat portion. Therefore, the fine convex pattern structure having the fine convex pattern projecting in the predetermined direction with respect to the flat portion can be produced with a good accuracy.

The "flat portion" as referred to in the present invention means a surface serving as a base portion of the projecting fine protruding structure and may be a flat surface or a non-flat surface such as a concave surface, a convex surface, or a curved surface.

In the above-described invention (invention 1), the electric charges may be induced on the inclined fine convex pattern by placing the fine convex pattern structure under an atmosphere in which the fine convex pattern structure can be electrically charged (invention 2), and the electric charges may be induced on the inclined fine convex pattern by dielectric polarization or electrostatic induction of at least the fine convex pattern (invention 3).

In the above-described inventions (inventions 1 to 3), the fine convex pattern structure may be constituted by an electrically insulating material (invention 4); and the fine convex pattern structure is constituted by a material including an electrically conductive material, and the electric charges may be induced on the inclined fine convex pattern in an electrically floating state of at least the fine convex pattern (invention 5).

The present invention also provides a method for producing a fine convex pattern structure having a flat portion and a fine convex pattern projecting from the flat portion in a predetermined direction with respect to the flat portion, with at least the fine convex pattern being constituted by a resin material that can be shrunk by energy from outside, the method including: using an imprint mold having a fine concave pattern corresponding to the fine convex pattern, and forming the fine convex pattern projecting from the flat portion under a condition in which the fine convex pattern is inclined to the flat portion side from the predetermined direction; and causing the fine convex pattern to project in the predetermined direction with respect to the flat portion by imparting the energy from the outside to a relatively extended side surface from among side surfaces of the inclined fine convex pattern (invention 6).

By forming the fine convex pattern under a condition such that the fine convex pattern is inclined to the flat portion side from the predetermined direction with respect to the flat portion, as in the abovementioned invention (invention 6), it is possible to reduce stresses acting on the fine convex pattern when the imprint mold is separated. Therefore, the separation of the imprint mold can be facilitated and the occurrence of defects such as cracks in the fine convex pattern can be inhibited. Where the fine convex pattern is so formed, the fine convex pattern can be inclined to the flat portion side from the predetermined direction, but by imparting the energy from the outside to the inclined fine convex pattern, it is possible to use the shrinkage force of the resin material constituting the fine convex pattern and cause the fine convex pattern to project in the predetermined direction with respect to the flat portion. Therefore, in accordance with the abovementioned invention (invention 6), a fine convex pattern structure having a fine convex pattern projecting in the predetermined direction with respect to the flat portion can be produced with a good accuracy by the nanoimprinting technique.

Further, for example, when a fine convex pattern structure having a plurality of linear fine convex patterns is produced, the contact state on the contact surface of the imprint mold and each of the plurality of linear fine convex patterns can differ among the patterns. Therefore, when the imprint mold is separated along the line direction of the fine convex patterns, the portions where the separation of the imprint mold and the linear fine convex patterns is started can differ in the easiness of separation. Further, when the imprint mold is separated along the line direction of the fine convex patterns, the fine convex patterns are difficult to incline. As a result, a state is realized in which the stresses applied in the in-plane direction to the fine convex patterns are difficult to relieve. For this reason, defects such as cracks can occur in linear fine convex patterns in the portions where the separation is started, and the linear fine convex patterns can have uneven length in the longitudinal direction. Meanwhile, where the imprint mold is separated in the direction crossing (substantially perpendicular) to the line direction, the stresses applied to the fine convex pattern in the in-plane direction can be easily relieved by inclining the fine convex pattern. Therefore, the uniformity of the longitudinal length of the formed linear fine convex patterns can be increased. In this case, however, the linear fine convex patterns are inclined along the separation direction of the imprint mold. Thus, where the fine convex pattern is formed to be inclined from the predetermined direction to the flat portion side, the dimensional accuracy of the fine convex pattern sometimes can be increased. In accordance with the above-described invention (invention 6), however, the energy is imparted from the outside to the inclined fine convex pattern, thereby making it possible to use the shrinkage force of the resin material constituting the fine convex pattern and cause the fine convex pattern to project in the predetermined direction with respect to the flat portion. Therefore, the fine convex pattern structure having the fine convex pattern projecting in the predetermined direction with respect to the flat portion can be produced with a good accuracy.

In the above-described invention (invention 6), by irradiating the relatively extended side surface of the inclined fine convex pattern with an active energy beam, the relatively extended side surface of the fine convex pattern is preferably shrunk (invention 7). In such invention (invention 7), the relatively extended side surface of the fine convex pattern may be shrunk by changing a chemical structure of the resin material in the relatively extended side surface of the fine convex pattern (invention 8).

In the above-described invention (invention 8), the relatively extended side surface of the fine convex pattern may be shrunk by promoting a crosslinking reaction of the resin material (invention 9), or the relatively extended side surface of the fine convex pattern may be shrunk by cutting a molecular chain of the resin material (invention 10).

In the above-described invention (invention 7), the relatively extended side surface of the fine convex pattern may be thermally shrunk (invention 11).

In the above-described inventions (inventions 6 to 11), the relatively extended side surface of the fine convex pattern is preferably shrunk by irradiating the fine convex pattern structure with an electron beam, an ion beam, UV radiation, IR radiation, visible light radiation, a laser beam, X rays, or gamma radiation (invention 12).

The present invention also provides a system for producing a fine convex pattern structure having a flat portion and a fine convex pattern projecting from the flat portion in a predetermined direction with respect to the flat portion, the system including: an inclined pattern formation unit that uses an imprint mold having a fine concave pattern corresponding to the fine convex pattern, and forms a fine convex pattern projecting from the flat portion under a condition in which the fine convex pattern is inclined to the flat portion side from the predetermined direction; and an electric charge imparting unit that causes the fine convex pattern to project in the predetermined direction with respect to the flat portion by inducing electric charges at least on the inclined fine convex pattern (invention 13).

The present invention also provides a system for producing a fine convex pattern structure that has a flat portion and a fine convex pattern projecting from the flat portion in a predetermined direction with respect to the flat portion, with at least the fine convex pattern being constituted by a resin material that can be shrunk by energy from outside, the system including: an inclined pattern formation unit that uses an imprint mold having a fine concave pattern corresponding to the fine convex pattern, and forms a fine convex pattern projecting from the flat portion under a condition in which the fine convex pattern is inclined to the flat portion side from the predetermined direction; and an energy imparting unit that causes the fine convex pattern to project in the predetermined direction with respect to the flat portion by imparting energy from outside to a relatively extended side surface, from among side surfaces of the inclined fine convex pattern formed by the inclined pattern formation unit (invention 14).

Advantageous Effect of the Invention

In accordance with the present invention, it is possible to provide a method for producing with a good accuracy a fine convex pattern structure having a fine convex pattern projecting in a predetermined direction and a system for producing the fine convex pattern structure for any configuration (shape etc.) of the fine convex pattern.

EMBODIMENTS FOR CARRYING OUT THE INVENTION

First Embodiment

Method for Producing Fine Convex Pattern Structure

Figure 1:
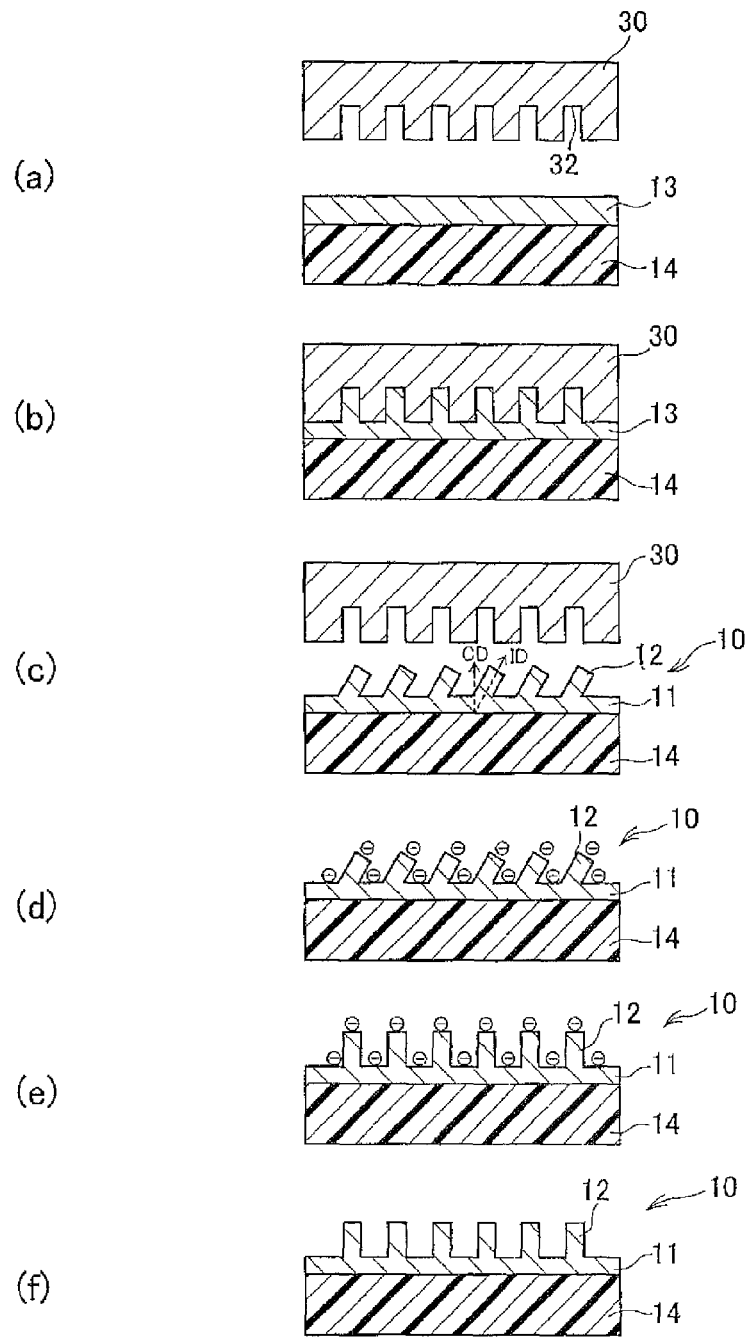
FIG. 1 is a flowchart showing, through a cut end surface, a method for producing a fine convex pattern structure according to the first embodiment of the present invention.

The first embodiment of the present invention will be explained below with reference to the appended drawings. FIG. 1 is a flow diagram showing, through a cut end surface, method for producing a fine convex pattern structure according to the first embodiment of the present invention.

In the method for producing a fine convex pattern structure according to the first embodiment, first, a predetermined substrate (for example, a silicon substrate, a metal substrate, a glass substrate, or a quartz substrate) 14 with an imprint resin film 13 formed thereon is prepared (see FIG. 1(a)). Then, an imprint mold 30 having a fine concave pattern 32 corresponding to a fine convex pattern 12 in a fine convex pattern structure 10 to be produced is pressed into the imprint resin film 13 on the substrate 14, and the imprint resin film 13 is cured in this state (see FIG. 1(b)).

Examples of resin materials constituting the imprint resin film 13 include resin materials (electrically insulating resin materials such as thermoplastic resins, thermosetting resins, and photocurable resins; electrically conductive resin materials) that are generally used for forming fine concave and convex patterns by nanoimprinting. Examples of such resin materials include resin materials such as olefin resins, styrene resins, ethylene resins, ester resins, thiophene resins, aniline resins, nylon resins, polyether resins, urethane resins, epoxy resins, phenol resins, acrylic resins, polyimide resins, and polyacetylene resins; silicone resins such polydimethylsiloxane and polysiloxanes; polypropylene, polycarbonate, polyamides, polyacetals, polyether ether ketone (PEEK), acrylonitrile butadiene styrene resin (ABS), polyphenylene sulfide resin (PPS), polyphenylene oxide, polyvinylidene fluoride, polysulfone, polylactic acid, polyethylene terephthalate (PET), and vinyl chloride.

Electrically conductive resin material can be obtained by doping a resin material such as a thermosetting resin or a thermoplastic resin with an electron acceptor or an electron donor such as a conductive metal, a carbon compound, and iodine. Examples of resin material that can be doped with the electron acceptor or electron donor included polyolefins, polyamides, polyimides, polyacetylene, polythiophenes, polyaniline, polyesters, phenolic resins, epoxy resins, acrylic resins, and polyurethanes.

Figure 2:
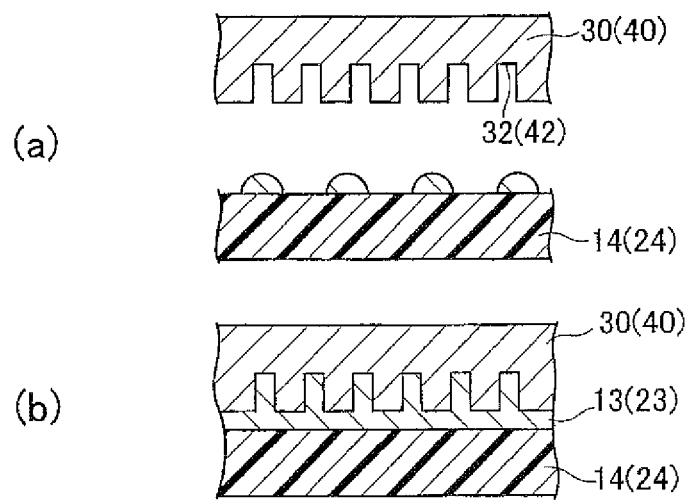
FIG. 2 is a flowchart showing, through a cut end surface, another example (variant 1) of a step for transferring the fine concave pattern of an imprint mold to an imprint resin film in the first and second embodiments of the present invention.
Figure 3:
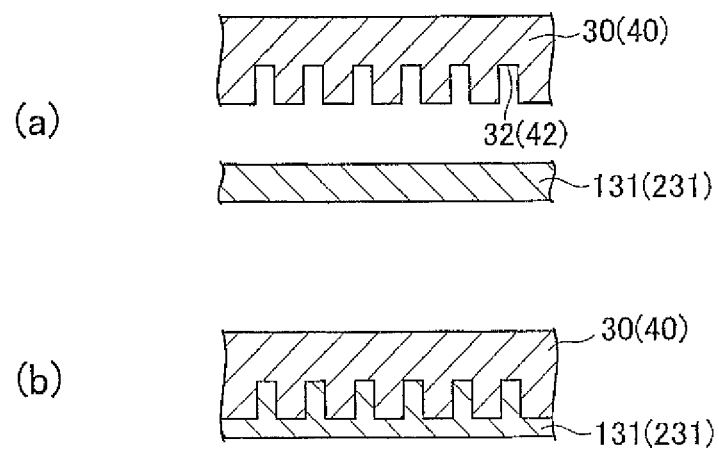
FIG. 3 is a flowchart showing, through a cut end surface, another example (variant 2) of a step for transferring the fine concave pattern of an imprint mold to an imprint resin film in the first and second embodiments of the present invention.

A method for forming the imprint resin film 13 on the substrate 14 is not particularly limited. For example, the imprint resin film 13 can be formed on the substrate 14 by using a spin coater or the like. In the first embodiment, the imprint mold 30 is pressed into the imprint resin film 13 preformed on the predetermined substrate 14, and the imprint resin film 13 is then cured (see FIGS. 1(a) and 1(b)), but the present invention is not limited to such a process. For example, a method may be used by which a resin material is discretely dropped on the substrate 14 by an ink jet method or the like, the resin material is then expanded by pressing the imprint mold 30 against the resin material, the fine concave pattern 32 of the imprint mold 30 is filled with the resin material, and the resin material is cured (see FIGS. 2(a) and 2(b)), or a method by which the imprint mold 30 is pressed against a resin film 131 constituted by a thermoplastic resin and heated to a temperature equal to or higher than the glass transition temperature of the thermoplastic resin, and the thermoplastic resin is cured (see FIGS. 3(a) and 3(b)).

A method for curing the imprint resin film 13 into which the imprint mold 30 has been pressed in the step shown in FIG. 1(b) can be selected, as appropriate, according to the type (curing type) of the resin material constituting the imprint resin film 13.

The imprint mold 30 is then separated from the cured imprint resin film 13 (see FIG. 1(c)). In this case, the fine convex pattern 12 is formed under the condition such that the fine convex pattern 12 projects in a direction ID inclined with respect to a direction CD perpendicular to a flat portion 11. As a result, the fine convex pattern structure 10 is produced that has the flat portion 11 and the fine convex pattern 12 projecting in the direction ID inclined with respect to the direction CD perpendicular to the flat portion 11. In the first embodiment, the flat portion 11 is constituted by the resin film remaining on the substrate 14 as a portion corresponding to a portion other than the fine concave pattern 32 of the imprint mold 30. The "direction CD perpendicular to the flat portion 11", as referred to herein means a direction perpendicular to the tangential line of the flat portion 11 that passes through an intersection point of the flat portion 11 and a segment (axial line) passing through the center of the fine convex pattern 12 in the width direction thereof, in a side surface view of the fine convex pattern structure 10 positioned such that the fine convex pattern 12 faces up and the flat portion 11 faces down, this side surface view being taken from one direction or another direction perpendicular to the one direction. Where the flat portion 11 is not on the even surface, the "direction CD perpendicular to the flat portion 11" means the aforementioned direction in each of the fine convex patterns 12.

Figure 12:
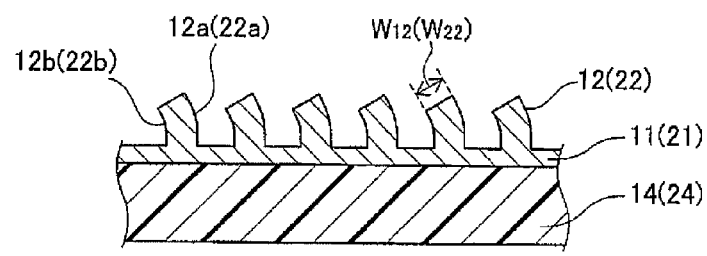
FIG. 12 is a cut end surface view showing a specific example of the fine convex pattern structure having the inclined fine convex pattern which is produced in the first and second embodiments of the present invention.

FIG. 1(*c*) shows schematically the fine convex pattern 12 that is formed according to the first embodiment and that projects in the direction ID inclined with respect to the direction CD perpendicular to the flat portion 11. However, actually, as shown in FIG. 12, in a side surface view, a side surface (in the example shown in FIG. 12, the left side surface in the side surface view) 12*b* opposite to the inclination direction (direction to the left in the example shown in FIG. 12) of the fine convex pattern 12 and the side surface (in the example shown in FIG. 12, the right side surface in the side surface view) 12*a* on the inclination direction side each have a substantially bow-like curved shape, and a thickness $W_{12}$ (length in the width direction) of the fine convex pattern 12 is substantially the same along the entire axial line direction of one fine convex pattern 12. With the fine convex pattern 12 having such a shape, it is possible to ensure that the pattern projects in the direction substantially perpendicular to the flat portion 11 in the below-described step (see FIG. 1(*e*)).

For example, a method for separating the imprint mold 30 from the imprint resin film 13 such that a force in the in-plane direction also acts upon the fine convex pattern 12 in addition to the force in the direction perpendicular to the flat portion 11 when the imprint mold 30 is separated can be used as a method for causing the fine convex pattern 12 to project in the inclination direction ID, that is, for creating the conditions such that the fine convex pattern 12 projects in the direction ID inclined with respect to the direction CD perpendicular to the flat portion 11.

Such a method may be realized by separating the imprint mold 30 so that a separation boundary portion of the imprint resin film 13 (substrate 14) and the imprint mold 30 has an inclination angle, preferably by separating the imprint mold 30 so that the stress acting in the in-plane direction upon the fine convex pattern 12 when the imprint mold 30 is separated is mainly applied to the fine convex pattern 12 in the direction of the minimum size thereof. Examples of such a method include a method by which the imprint mold 30 is separated by pulling from the corner portion or one side of the imprint mold 30, and a method by which the imprint mold 30 is separated along the direction crossing (substantially perpendicular to) a line direction of the fine convex pattern 12 when the fine convex pattern 12 has a linear shape. Where the imprint mold 30 is thus separated from the imprint resin film 13, the stress applied to the fine convex pattern 12 when the imprint mold 30 is separated can be reduced. Therefore, the occurrence of defects such as cracks in the fine convex pattern 12 can be inhibited and the fine convex pattern 12 of a high dimensional accuracy can be formed. In particular, where the imprint mold 30 is separated from the imprint resin film 13 by the latter method, the linear fine convex pattern 12 with a highly accurate length in the longitudinal direction (line length) can be formed. Where the fine convex pattern 12 has a linear shape, it is most preferred than the direction of separation of the imprint mold 30 intersect the line direction of the fine convex pattern 12, but the imprint mold 30 may be also separated along the line direction or the imprint mold 30 may be separated along the direction having components of the line direction and a direction intersecting the line direction, provided that the shape change of the fine convex pattern 12 occurring during separation along the line direction is within the allowed range.

Figure 4:
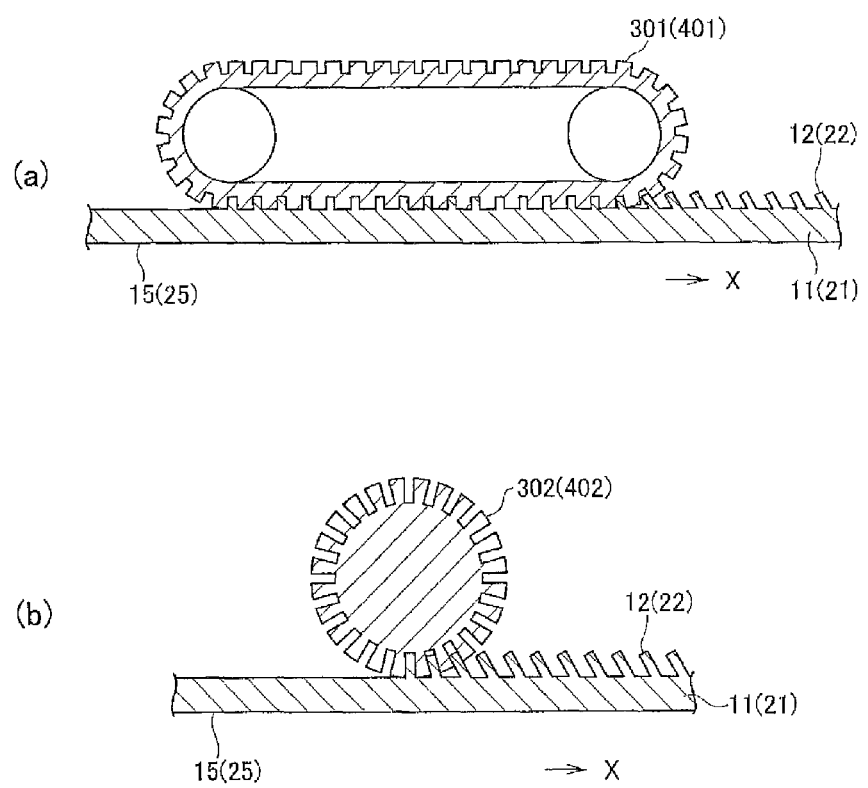
FIG. 4 is a cut end surface view showing another example of a step for forming an inclined fine convex pattern by using an imprint mold in the first embodiment of the present invention.

In addition to the above-described methods, a method by which a resin sheet 15 constituted by the abovementioned resin material is transported in one direction X, the rotation of a belt-shaped imprint mold 301 or a cylindrical imprint mold 302 is synchronized with the transportation of the resin sheet 15, and the belt-shaped imprint mold 301 or the cylindrical imprint mold 302 is continuously brought into contact with the resin sheet 15 can be also used for causing the fine convex pattern 12 to project in the direction ID inclined with respect to the direction CD perpendicular to the flat portion 11 (see FIGS. 4(*a*) and 4(*b*)). When the fine convex pattern structure 10 having the linear fine convex pattern 12 is produced by the method shown in FIGS. 4(*a*) and 4(*b*) and the line direction of the linear fine convex pattern 12 crosses (substantially perpendicular to) the transportation direction X of the resin sheet 15, it is possible to form the fine convex pattern 12 projecting in the direction ID inclined with respect to the direction CD perpendicular to the flat portion 11.

In the case in which the fine convex pattern 12 projecting in the inclined direction ID is formed under the condition such that the fine convex pattern 12 projects in the direction ID inclined with respect to the direction CD perpendicular to the flat portion 11, the dimensions and aspect ratio of the fine convex pattern 12 are not particularly limited, provided that they ensure that the fine convex pattern 12 can be caused by the above-described methods to project in the inclined direction ID, the specific dimensions and aspect ratio depending on the type of the resin material constituting the fine convex pattern 12 and the shape (linear, pillar-shaped, cross-shaped, L-shaped, etc.) of the fine convex pattern 12.

Further, although the dimensions and/or aspect ratio of the fine convex pattern 12, which is to be formed, also depends on the type of the resin material constituting the imprint resin film 13 and the shape (linear, pillar-shaped, cross-shaped, L-shaped, etc.) of the fine convex pattern 12 in the fine convex pattern structure 10 which is planned for production, where the dimensions and/or aspect ratio is such that the fine convex pattern 12 is inclined with respect to the direction CD perpendicular to the flat portion 11 when the imprint mold 30 is pulled up for separation in the direction CD perpendicular to the flat portion 11, the fine convex pattern 12 can be caused to project in the direction ID inclined with respect to the direction CD perpendicular to the flat portion 11 by pulling up the imprint mold 30 for separation in the direction CD perpendicular to the flat portion 11.

For example, when the fine convex pattern structure 10 having the pillar-shaped fine convex pattern 12 is produced, the inclined fine convex pattern 12 can be formed regardless of the method for separating the imprint mold 30 when the size of the fine convex pattern 12 is about equal to or less than 100 nm and the aspect ratio thereof is about equal to or greater than 2.0.

The specified dimension (about equal to or less than 100 nm) of the fine convex pattern 12 mentioned hereinabove is only an example of specified dimensions that make it possible to form the fine convex pattern 12 projecting in the inclined direction ID when the cylindrical pillar-shaped fine convex pattern 12 with an aspect ratio of 2.0 is to be formed by using the resin material such as described hereinabove, and the fine convex pattern projecting in the inclined direction ID can be formed even when the dimension of 100 nm is exceeded. The same is true with respect to the specified value (about equal to or greater than 2.0) of aspect ratio, and the fine convex pattern 12 projecting in the inclined direction ID can be also formed when the aspect ratio is less than 2.0 correspondingly to the structure of the fine convex pattern 12 (cylindrical pillar-shaped, polygonal pillar-shaped, linear, L-shaped, cross-shaped, etc.) and the type of the resin material.

In the first embodiment, where a plurality of fine convex patterns 12 is included in the fine convex pattern structure 10 when the fine convex pattern 12 is formed that projects in the direction ID inclined with respect to the direction CD perpendicular to the flat portion 11, all of the fine convex patterns 12 may be inclined or only some of the fine convex patterns 12 may be inclined.

In the first embodiment, in order to cause the inclined fine convex pattern 12 to project in the direction substantially perpendicular to the flat portion 11 by inducing electric charges at the fine convex pattern structure 10 (see FIGS. 1(d) to 1(f)), as will be described hereinbelow, it is preferred that the thickness of the flat portion 11 be such that makes it possible to induce the electric charges on the surface of the flat portion 11.

When the fine convex pattern structure 10 formed on the substrate 14 is to be used, for example, as a mask for etching the substrate 14, the residual resin film remaining on the substrate 14 is typically removed in an ashing step as a pretreatment for etching the substrate 14, but the fine convex pattern 12 can be deformed and the dimensions of the fine convex pattern 12 can change when the residual resin film is subjected to ashing, and the etching accuracy of the substrate 14 can thus be decreased. In order to resolve this problem, when the fine convex pattern structure 10 is used as a mask during etching of the substrate 14, it is desirable that the residual resin film be made extremely thin.

Therefore, when the flat portion 11 is constituted by the residual resin film present on the substrate 14, it is desirable that the thickness of the residual resin film (flat portion 11) be such that electric charges could be effectively induced on the surface of the residual resin film (flat portion 11) while paying attention to the effect produced on the deformation and dimensional changes of the fine convex pattern 12 occurring when the residual resin film is removed.

Even when the flat portion 11 constituted by the residual resin film is made to have a thickness that allows only for the electrical charging such that the fine convex pattern 12, which is to be inclined, is unlikely to be projected in the direction substantially perpendicular to the flat portion 11, where the fine convex pattern structure 10 is produced on the substrate 14, as shown in FIG. 1, where the substrate 14 is an electrically insulating substrate or a conductive substrate that has not been grounded, the substrate 14, which is significantly thicker than the flat portion 11, is electrically charged, and therefore the inclined fine convex pattern 12 can be projected in the direction substantially perpendicular to the flat portion 11 by using an electric repulsion force acting between the electrically charged substrate 14 and the fine convex pattern 12.

Meanwhile, where the substrate 14 is an electrically conductive substrate and in a grounded state when electric charges are induced on the fine convex pattern structure 10, when the thickness of the flat portion 11 is extremely small, some of the electric charges appearing on the flat portion 11 escape to the substrate 14. In such a case, it is preferred that the fine convex pattern 12 and the flat portion 11 be in a state in which the sufficient number of electric charges could be retained thereby even after some charges have escaped to the electrically conductive substrate 14. More specifically, it is preferred that the resin material constituting the flat portion 11 have a high dielectric constant and it is also preferred that the thickness and surface area (area of the contact surface with the substrate 14) of the flat portion 11 be as large as possible.

Then, electric charges are generated in the fine convex pattern structure 10 having the flat portion 11 and the fine convex pattern 12 projecting in the direction ID inclined with respect to the direction CD perpendicular to the flat portion 11 (see FIG. 1(d)). Thus, the fine convex pattern structure 10 is electrically charged. By so electrically charging the fine convex pattern structure 10, it is possible to cause the inclined fine convex pattern 12 to project in the direction substantially perpendicular to the flat portion 11 (see FIG. 1(e)). Causing the fine convex pattern 12 to project in the direction substantially perpendicular to the flat portion 11 means that the angle formed with the flat portion 11 by the sector (axial line of the fine convex pattern 12) passing through the center, in the width direction, of the bottom portion (portion that is in contact with the upper surface of the flat portion 11) of the fine convex pattern 12 and the center, in the width direction, of the top portion of the fine convex pattern 12 is substantially 90° in a side surface view from one surface of the fine convex pattern structure 10 in which the fine convex pattern 12 faces up and the flat portion 11 faces down and also in a side surface view from the other surface that is perpendicular to the one surface. This angle formed with the flat portion 11 may be within an allowed range depending on the application (for a lithography mask or the like) of the fine convex pattern structure 10. More specifically, this angle may be within a range of 90°±10°.

In the first embodiment, as a result of electrically charging the fine convex pattern structure 10, an electric repulsion force is generated not only between the fine convex pattern 12 and the flat portion 11, but also between the adjacent fine convex patterns 12. As a consequence, the inclined fine convex pattern 12 projects in the direction substantially perpendicular to the flat portion 11. Therefore, where the distance between the adjacent fine convex patterns 12 in the fine convex pattern structure 10 is too large, it can be difficult to generate effectively the electric repulsion force therebetween. Thus, in the first embodiment, it is preferred that the distance between the adjacent fine convex patterns 12 be such that an electric repulsion force sufficient to cause the inclined fine convex patterns 12 to project in the direction substantially perpendicular to the flat portion 11 could act between the adjacent fine convex patterns 12. In particular, when the height of the fine convex pattern 12 is less than the distance between the adjacent fine convex patterns 12, it is preferred that the distance be about equal to or less than a two-fold size (width) of the fine convex pattern 12.

A method for inducing the electric charges on the fine convex pattern structure 10 is not particularly limited, provided that the electric charges of the same polarity can be induced on the surface of the flat portion 11 and on the surface of the fine convex pattern 12. Examples of suitable methods include a method by which a plasma generator and a dry etching device are used and the fine convex pattern structure 10 is arranged under an atmosphere in which the fine convex pattern structure 10 can be electrically charged, such as a plasma atmosphere, thereby inducing electric charges of the same polarity (for example, negative electric charges) on the flat portion 11 and the fine convex pattern 12, and a method by which the fine convex pattern structure 10 is arranged in an electric field generated by an electric field generator or the like, and electric charges of the same polarity (negative electric charges or positive electric charges) are caused to be unevenly distributed on the surface of the flat portion 11 and the fine convex pattern 12 by induction polarization or electrostatic induction of the fine convex pattern structure 10. A specific method may be selected, as appropriate, as has already been mentioned hereinabove, according to the thickness of the fine convex pattern 12 and the type of the resin material. In the case in which a method by which the fine convex pattern structure 10 is arranged under a plasma atmosphere formed by using a dry etching device is selected as the method for inducing electric charges on the fine convex pattern structure 10, it is preferred that the plasma atmosphere be formed at power (for example, when dry etching processing is performed using a dry etching device, the power about equal to or less than 80%, preferably about 50% to 70%, of the plasma power at which the desired etching rate of the substrate 14 is obtained) such that the fine convex pattern structure 10 (in particular, the remaining resin film and substrate 14) is substantially not etched, and it is also preferred that a high-frequency current be not applied, as desired, to the electrode on which the fine convex pattern structure 10 has been placed (that cations present in the plasma be unlikely to be drawn to the fine convex pattern structure 10). As a result, electric charges can be induced on the fine convex pattern structure 10, without etching the fine convex pattern molded body in the plasma atmosphere.

A method for temporarily generating high-density electric charges under the atmosphere in which the fine convex pattern structure 10 is present is also effective when the objective is to induce electric charges on the fine convex pattern structure 10. However, the condition for generating such high-density electric charges, for example, by temporary increasing the plasma output, is equivalent or close to the condition under which the substrate 14 is easily etched. Therefore, the condition for generating the high-density electric charges should be set such as to reduce the etching amount of the substrate 14 to a negligibly low level, for example, by shortening the plasma output time, reducing the bias voltage for drawing out the ions to the substrate 14 side (for example, reducing the output of the draw-out electrode electrically connected to the substrate 14), and using an etchant with a low etching rate of the substrate 14, which is different from the etchant used during etching of the substrate 14.

When electric charges are induced on the fine convex pattern structure 10, the charge is induced on the surface of the fine convex pattern 12 and the flat portion 11 in an amount such that generates an electric repulsion force causing the inclined fine convex pattern 12 to project in the direction substantially perpendicular to the flat portion 11. Such a charge amount can be set, as appropriate, according to the dimensions and aspect ratio of the fine convex pattern 12, physical properties (for example, modulus of elasticity) of the resin material constituting the fine convex pattern 12, the degree of inclination (inclination angle) of the fine convex pattern 12, and distance between the adjacent fine convex patterns 12.

Further, when the fine convex pattern 12 and the flat portion 11 are constituted by a conductor (for example, an electrically conductive polymer), where the fine convex pattern 12 or flat portion 11 constituted by the conductor are grounded, electric charges cannot be induced on the surface of the fine convex pattern 12 and the flat portion 11 (the surface cannot be electrically charged) even when the fine convex pattern structure 10 is arranged under a plasma atmosphere with the object of inducing electric charges on the fine convex pattern structure 10. Therefore, in such a case, the entire fine convex pattern structure 10 or a partial region of the fine convex pattern structure 10 (for example, the region (charge imparting region) which is the object of causing the inclined fine convex pattern 12 to project in the direction substantially perpendicular to the flat portion 11) should be set into an electrical floating state (a state without electric connection and a state without grounding).

Figure 5:
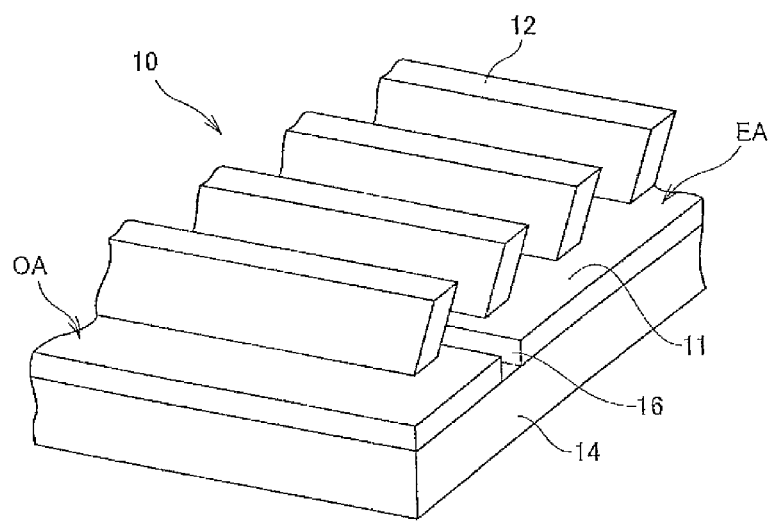
FIG. 5 is a perspective view showing another example (variant 1) of the fine convex pattern structure having the inclined fine convex pattern which is produced in the first embodiment of the present invention.

For example, when the fine convex pattern structure 10 (fine convex pattern 12 and flat portion 11) is constituted by an electrically conductive polymer and the fine convex pattern structure 10 is provided on the electrically insulating substrate 14 such as a glass substrate, the partial region of the fine convex pattern structure 10 can be set into the electrical floating state by dividing the fine convex pattern structure 10 into a charge imparting region EA and other region OA with a slit 16, as shown in FIG. 5. By grounding the other region OA, it is possible to induce electric charges only on the charge imparting region EA and cause only the fine convex pattern 12 in the charge imparting region EA to project in the direction substantially perpendicular to the flat portion 11.

As a result of inducing electric charges (for example, negative electric charges) of the same polarity on the surface of the flat portion 11 and the fine convex pattern 12, as described hereinabove, the electric repulsion force acting between the fine convex pattern 12 and the flat portion 11 and also between the adjacent fine convex patterns 12 deforms the fine convex pattern 12 in the direction of receding from the flat portion 11 and causes the fine convex pattern 12 to project in the direction substantially perpendicular to the flat portion 11 (see FIG. 1(e)).

Finally, the electric charges generated on the fine convex pattern structure 10 are released (FIG. 1(f)). Where the fine convex pattern structure 10 is maintained in the charged state, various adverse effects can be demonstrated. For example, where the charged state is maintained, fine foreign matter present in the surrounding atmosphere can be easily attracted and caused to adhere to the fine convex pattern structure 10, and where the substrate 14 is thereafter etched by using the fine convex pattern structure 10 located on the substrate 14 as a mask, the etching accuracy can decrease. Further, when the fine convex pattern structure 10 having the fine convex pattern 12 and the flat portion 11 constituted by a predetermined resin material is used as is as a final product (for example, a nanopillar array structure of a cell culturing sheet, a moth-eye film, a micro-needle array, a polarization film, a metamaterial, a hydrophilic film, or a water-repelling film), it is possible that the desired functions will not be demonstrated due to the properties of the foreign matter than has adhered to the fine convex pattern structure 10. Further, defects can be caused in the fine convex pattern 12 by the electric charges (static electricity). Therefore, the occurrence of adverse effects caused by the above-described electric charging of the fine convex pattern structure 10 can be inhibited by releasing the electric charges from the fine convex pattern structure 10.

A method for releasing the electric charges from the fine convex pattern structure 10 is not particularly limited. For example, when electric charges are induced on the surface of the fine convex pattern structure 10 by arranging the structure under a plasma atmosphere, as in the step shown in FIG. 1(d), the electric charges can be released by bringing a conductor into contact with the fine convex pattern structure 10. Alternatively, the electric charges present on the surface of the fine convex pattern structure 10 can be neutralized by inducing electric charges of a polarity opposite that of the electric charges that have been induced on the surface of the fine convex pattern structure 10. Further, in the step shown in FIG. 1(d), where the electric charges are induced on the surface of the fine convex pattern structure 10 by dielectric polarization or electrostatic induction, the uneven distribution of the electric charges in the fine convex pattern structure 10 can be eliminated by removing the fine convex pattern structure 10, which has been placed into an electric field, from the electric field.

When the electric charges are released from the fine convex pattern structure 10 and the fine convex pattern 12 projecting in the direction substantially perpendicular to the flat portion 11 under the action of the electrical repulsion force is inclined again (the case in which the fine convex pattern returns to the state before the electric charges are induced), the abovementioned electric discharge step (FIG. 1(f)) may be omitted. In particular, is not necessary to release the electric charges from the fine convex pattern structure 10 and the abovementioned electric discharge step (FIG. 1(*f*)) may be omitted, provided that the next step can be implemented although the fine convex pattern structure 10 remains in the electrically charged state under an environment in which the abovementioned adverse effect caused by the release of electric charges from the fine convex pattern structure 10 is not demonstrated, or an environment in which the probability of such an adverse effect is extremely low. For example, when a dry etching step is to be implemented after the fine convex pattern 12 has been caused to project in the direction substantially perpendicular to the flat portion 11, a dry etching device is used in the step shown in FIG. 1(*d*), the plasma output is adjusted to a degree such that the etching amount substantially can be ignored, or such that no etching is performed, and electric charges are induced on the fine convex pattern structure 10 by arranging the fine convex pattern structure 10 under a plasma atmosphere, if desired, without applying a high-frequency electric current to the electrode on which the fine convex pattern structure 10 is disposed, thereby causing the fine convex pattern 12 to project in the direction substantially perpendicular to the flat portion 11 (FIG. 1(*e*)). Then, the plasma output may be increased in this state and the dry etching step may be implemented without releasing the electric charges from the fine convex pattern structure 10 present under the plasma atmosphere. The advantage of such a method is that the dry etching step, which is the next step, can be directly implemented while causing the fine convex pattern 12 to project in the direction substantially perpendicular to the flat portion 11, and the throughput can be increased.

The above-described method for producing the fine convex pattern structure according to the first embodiment is particularly advantageous in the production of a cell culturing sheet having a nano-pillar array structure, a film (moth eye film) having a moth eye structure (a structure simulating a moth eye pattern, that is, a structure having arranged therein a fine convex pattern of an order of several tens to several hundreds of nanometers), and a polarization film (a film that controls the light oscillation direction, for example, a film constituted by a line-and-space pattern in a specific direction, the pattern being disposed, as appropriate, with respect to the light incidence direction, thereby selectively blocking and transmitting the light).

Where a cell culturing sheet having a nano-pillar array structure is produced according to the first embodiment, the imprint mold 30 having a nano-hole array structure corresponding to the nano-pillar array structure is pressed into the imprint resin film 13 (see FIG. 1(*b*)). Then, a cell culturing sheet in which the nano-pillar array structure (fine convex pattern 12) projects in the direction substantially perpendicular to the flat portion 11 can be produced by implementing the steps shown in FIGS. 1(*c*) to 1(*f*). When the cell culturing sheet having the nano-pillar array structure is used, the cells are brought into contact with the fine convex pattern 12. Therefore, in some cases it is undesirable to form a mold release agent layer on the imprint mold 30. This is because the mold release agent layer can poison the cells. Therefore, a large stress is applied when the imprint mold 30 is separated from the imprint resin film 13. Thus, the stress occurring during the separation of the imprint mold 30 can be reduced by producing the cell culturing sheet having the nano-pillar array structure according to the first embodiment.

When a moth eye film is produced according to the first embodiment, first the surface of an aluminum base material is anodized to form the aluminum base material having a plurality of fine concave portions and, if desired, the plurality of fine concave portions is expanded by etching the aluminum base material. The aluminum base material having the plurality of fine concave portions, which has thus been formed, is used as an imprint mold and the aluminum base material is pressed into an imprint resin film. In this case, typically, as shown in FIGS. 4(*a*) and 4(*b*), the aluminum base material is used in the form of the belt-shaped imprint mold 301 or the cylindrical imprint mold 302, and the belt-shaped or cylindrical imprint mold 301, 302 is continuously brought into contact with the resin sheet 15. Then, a moth eye film in which the fine convex pattern 12 projects in the direction substantially perpendicular to the flat portion 11 can be produced by implementing the steps shown in FIGS. 1(*c*) to 1(*f*). The belt-shaped or cylindrical imprint mold 301, 302 enables mass production of the moth eye film by continuous contact with the resin sheet 15, but in such a process, the separation ability of the belt-shaped or cylindrical imprint mold 301, 302 can be gradually degraded. However, according to the first embodiment, the moth eye film in which the fine convex pattern 12 projects in the direction substantially perpendicular to the flat portion 11 can be produced with a high accuracy even in such a case. A polarization film can be also produced, for example, by using a mold having the line-and-space structure and implementing the steps same as those in the production of the moth eye film.

As indicated hereinabove, with the method for producing a fine convex pattern structure according to the first embodiment, the fine convex pattern 12 can be formed under the condition such that the fine convex pattern 12 projects in the inclined direction. Therefore, when the imprint mold 30 is separated from the imprint resin film 13, the occurrence of defects such as cracks in the fine convex pattern 12 can be inhibited. In addition, since the fine convex pattern 12 can be caused to project in the direction substantially perpendicular to the flat portion 11 by inducing electric charges on the inclined fine convex pattern 12 and using the electric repulsion force, the fine convex pattern structure 10 having the fine convex pattern 12 projecting substantially perpendicular to the flat portion 11 can be produced with a good accuracy.

Further, with the method for producing the fine convex pattern structure according to the first embodiment, since the inclined fine convex pattern 12 can be caused to project in the direction substantially perpendicular to the flat portion 11, it is possible to produce with a good accuracy even the fine convex pattern structure 10 having the fine convex pattern 12 with fine dimensions and a high aspect ratio that could not be formed by the conventional nanoimprinting technique due to the tumbling of the pattern.

[System for Producing Fine Convex Pattern Structure]

Figure 6:
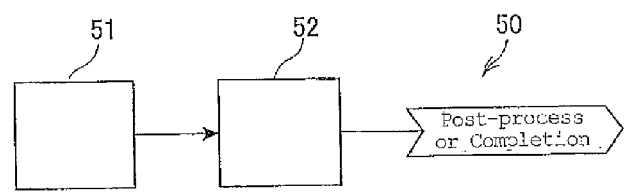
FIG. 6 is a block diagram showing a schematic configuration of a system for producing a fine convex pattern structure in the first embodiment of the present invention.

A system capable of implementing the method for producing the above-described fine convex pattern structure according to the first embodiment is explained below. FIG. 6 is a block diagram illustrating the schematic configuration of the system for producing the fine convex pattern structure according to the present embodiment.

As shown in FIG. 6, a system 50 for producing the fine convex pattern structure according to the first embodiment includes an inclined pattern formation unit 51 that produces the fine convex pattern structure 10 having the flat portion 11 and the fine convex pattern 12 projecting from the flat portion 11 under the conditions such that the fine convex pattern 12 projects in the direction ID inclined with respect to the direction CD perpendicular to the flat portion 11, and a charge imparting unit 52 that causes the inclined fine convex pattern 12 to project in the direction substantially perpendicular to the flat portion 11 by inducing electric charges on the fine convex pattern structure 10 produced with the inclined pattern formation unit 51.

The inclined pattern formation unit 51 is constituted by a single device or a plurality of device groups that are typically used for producing the fine convex pattern structure 10. For example, this unit can be an optical nanoimprinting device or thermal nanoimprinting device provided with a substrate stage onto which the substrate 14 is placed, a holding unit for holding the imprint mold 30 such that the surface of the imprint mold 30 where the fine concave pattern 32 has been formed faces the substrate 14 placed on the substrate stage, and an imprint chamber for performing the imprint processing, or a sheet nanoimprinting device that uses the belt-shaped imprint mold 301 or the cylindrical imprint mold 302 and presses the belt-shaped imprint mold 301 or the cylindrical imprint mold 302 against an elongated sheet-shaped (resin sheet 15 or the like) transfer body, while transporting the transfer body, thereby producing the elongated sheet-shaped fine convex pattern structure 10 (see FIGS. 4(a) and 4(b)).

The optical nanoimprinting device or thermal nanoimprinting device is further provided with a mechanism that makes it possible to move the holding unit in a manner such that a stress in the in-plain direction acts upon the fine convex pattern 12 when the imprint mold 30 is separated from the imprint resin film 13 located on the substrate 14. By providing such a mechanism, it is possible to produce the fine convex pattern structure 10 having the fine convex pattern 12 projecting in the direction ID inclined with respect to the direction CD perpendicular to the flat portion 11.

In the sheet nanoimprinting device, a stress in the in-plain direction necessarily acts upon the fine convex pattern 12 (the fine convex pattern 12 is tensioned in the direction opposite to the transportation direction X of the transfer body (resin sheet or the like)) when the belt-shaped imprint mold 301 or the cylindrical imprint mold 302 is pulled off from the transfer body (resin sheet 15 or the like). Therefore, it is possible to produce the fine convex pattern structure 10 having the fine convex pattern 12 projecting in the direction ID inclined with respect to the direction CD perpendicular to the flat portion 11.

The device configuration that can be used as the charge imparting unit 52 is not particularly limited, provided that electric charges can be induced on the fine convex pattern structure 10 and the inclined fine convex pattern 12 can be caused to project in the direction substantially perpendicular to the flat portion 11. For example, a plasma generator having a plasma chamber, a dry etching device having a plasma generator, and an electric field generator can be used as the charge imparting unit.

In the system 50 for producing the fine convex pattern structure having the above-described configuration, the fine convex pattern structure 10 having the inclined fine convex pattern 12 is produced in the inclined pattern formation unit 51, and electric charges are induced on the fine convex pattern structure 10 in the charge imparting unit 52. As a result, it is possible to produce the fine convex pattern structure 10 having the flat portion 11 and the fine convex pattern 12 projecting in the direction substantially perpendicular to the flat portion 11 by using an electrostatic repulsion force acting between the fine convex pattern 12 and the flat portion 11 and between the adjacent fine convex patterns 12.

Thus, with the system 50 for producing the fine convex pattern structure according to the first embodiment, by producing the fine convex pattern structure 10 with the inclined fine convex pattern 12 in the inclined pattern formation unit 51, it is possible to inhibit the occurrence of defects such as cracks in the fine convex pattern 12. Further, in the charge imparting unit 52, the inclined fine convex pattern 12 can be caused to project in the direction substantially perpendicular to the flat portion 11. Therefore, the fine convex pattern structure 10 having the fine convex pattern 12 projecting in the direction substantially perpendicular to the flat portion 11 can be produced with a good accuracy.

Further, with the system 50 for producing the fine convex pattern structure according to the first embodiment, since the inclined fine convex pattern 12 can be caused to project in the direction substantially perpendicular to the flat portion 11, it is possible to produce with a good accuracy even the fine convex pattern structure 10 having the fine convex pattern 12 with fine dimensions and a high aspect ratio that could not be formed by the conventional nanoimprinting technique due to the tumbling of the pattern.

Second Embodiment

Method for Producing Fine Convex Pattern Structure

Figure 7:
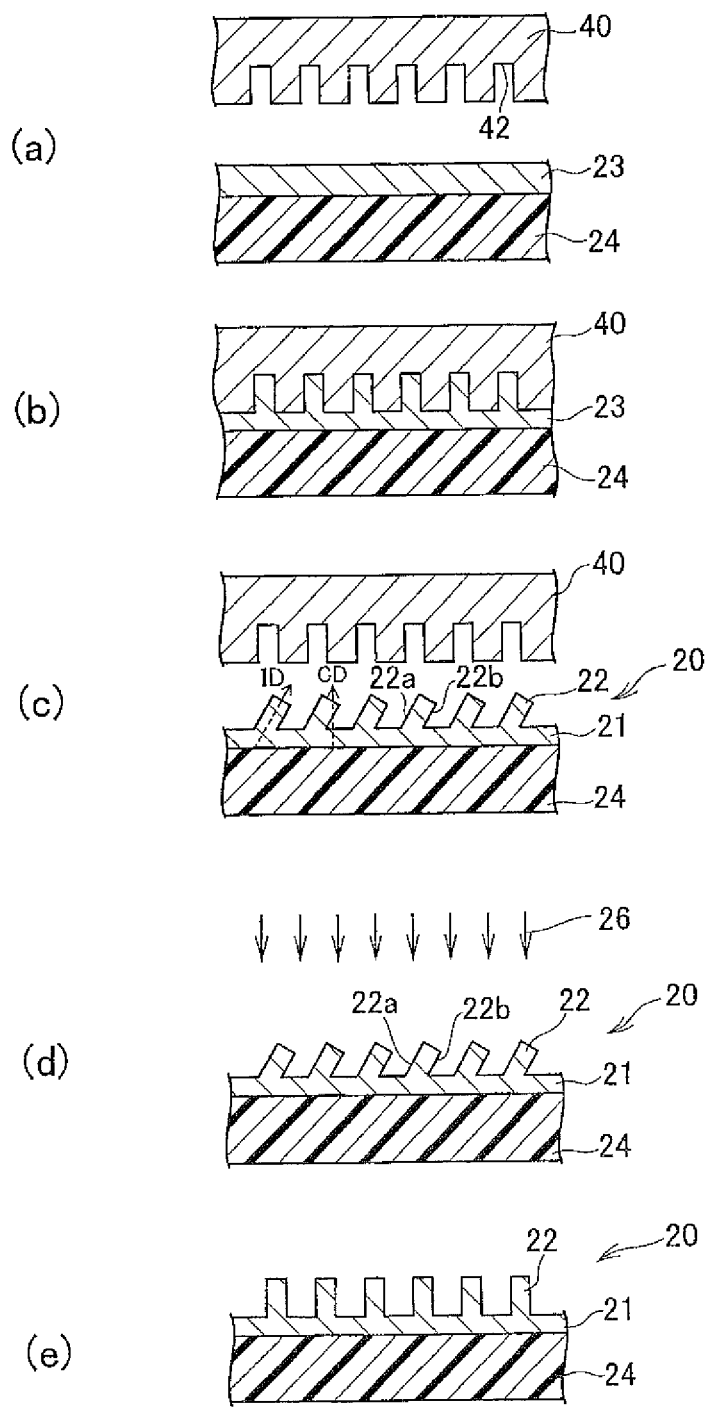
FIG. 7 is a flow diagram showing, through a cut end surface, a method for producing a fine convex pattern structure according to the second embodiment of the present invention.

The second embodiment of the present invention will be explained below with reference to the appended drawings. FIG. 7 is a flow diagram showing, through a cut end surface, a method for producing a fine convex pattern structure according to the second embodiment of the present invention.

In the method for producing a fine convex pattern structure according to the second embodiment, similarly to the method for producing a fine convex pattern structure according to the first embodiment, first, a predetermined substrate (for example, a silicon substrate, a metal substrate, a glass substrate, or a quartz substrate) 24 with an imprint resin film 23 formed thereon is prepared (see FIG. 7(a)). Then, an imprint mold 40 having a fine concave pattern 42 corresponding to a fine convex pattern 22 in a fine convex pattern structure 20 to be produced is pressed into the imprint resin film 23 on the substrate 24, and the imprint resin film 23 is cured in this state (see FIG. 7(b)).

Examples of resin materials constituting the imprint resin film 23 include resin materials (electrically insulating resin materials such as thermoplastic resins, thermosetting resins, and photocurable resins) which are generally used for forming fine concave and convex patterns by nanoimprinting and which can be shrunk by imparting energy from the outside. Resin material same as those described by way of example as the resin materials constituting the imprint resin film 13 in the first embodiment can be used as the aforementioned resin materials.

A method same as that of the first embodiment can be also used for forming the imprint resin film 23 on the substrate 24. The second embodiment may also use a method in which a resin material is discretely dropped on the substrate 24 by an ink jet method or the like, the resin material is then expanded by pressing the imprint mold 40 against the resin material, the fine concave pattern 42 of the imprint mold 40 is filled with the resin material, and the resin material is cured (see FIGS. 2(a) and 2(b)), or a method by which the imprint mold 40 is pressed against a resin film 231 constituted by a thermoplastic resin and heated to a temperature equal to or higher than the glass transition temperature of the thermoplastic resin, and the thermoplastic resin is cured (see FIGS. 3(a) and 3(b)), those methods being the same as used in the first embodiment. The method of the first embodiment can be also used for curing the imprint resin film 23 in the step shown in FIG. 7(b).

The imprint mold 40 is then separated from the cured imprint resin film 23 (see FIG. 7(c)). In this case, the fine convex pattern 22 is formed under the condition such that the fine convex pattern 22 projects in the direction ID inclined with respect to the direction CD perpendicular to the flat portion 21. As a result, the fine convex pattern structure 20 is produced that has the flat portion 21 and the fine convex pattern 22 projecting in the direction ID inclined with respect to the direction CD perpendicular to the flat portion 21. In the second embodiment, the flat portion 21 is constituted by the resin film remaining on the substrate 24 as portions corresponding to portions other than the fine concave pattern 42 of the imprint mold 40. The thickness of the flat portion 21 can be set, as appropriate, according to the application of the fine convex pattern structure 20 which is to be produced.

FIG. 7(c) shows schematically the fine convex pattern 22 formed according to the second embodiment and projecting in the direction ID inclined with respect to the direction CD perpendicular to the flat portion 21. However, actually, as shown in FIG. 12, in a side surface view, a side surface (in the example shown in FIG. 12, the left side surface in the side surface view) 22b opposite to the inclination direction (direction to the left in the example shown in FIG. 12) of the fine convex pattern 22 and the side surface (in the example shown in FIG. 12, the right side surface in the side surface view) 22a on the inclination direction side each have a substantially bow-like curved shape, and a thickness $W_{22}$ length in the width direction) of the fine convex pattern 22 is substantially the same along the entire axial line direction of one fine convex pattern 22. With the fine convex pattern 22 having such a shape, it is possible to ensure that the pattern projects in the direction substantially perpendicular to the flat portion 21 in the below-described step (see FIG. 7(e)).

A method same as that of the first embodiment can be used for creating the conditions such that the fine convex pattern 22 projects in the direction ID inclined with respect to the direction CD perpendicular to the flat portion 21, that is, as the method for causing the fine convex pattern 22 to project in the inclined direction ID. For example, a method for separating the imprint mold 40 from the imprint resin film 23 such that a force in the in-plane direction also acts upon the fine convex pattern 22 in addition to the force in the direction perpendicular to the flat portion 21 when the imprint mold 40 is separated can be used.

Such a method may be realized by separating the imprint mold 40 so that a separation boundary portion of the imprint resin film 23 (substrate 24) and the imprint mold 40 has an inclination angle, preferably by separating the imprint mold 40 so that the stress acting in the in-plane direction upon the fine convex pattern 22 when the imprint mold 40 is separated is mainly applied to the fine convex pattern 22 in the direction of the minimum size thereof. Examples of such a method include a method by which the imprint mold 40 is separated by pulling from the corner portion or one side of the imprint mold 40, and a method by which the imprint mold 40 is separated along the direction crossing (substantially perpendicular to) a line direction of the fine convex pattern 22 when the fine convex pattern 22 has a linear shape. Where the imprint mold 40 is thus separated from the imprint resin film 23, the stress applied to the fine convex pattern 22 when the imprint mold 40 is separated can be reduced. Therefore, the occurrence of defects such as cracks in the fine convex pattern 22 can be inhibited and the fine convex pattern 22 of a high dimensional accuracy can be formed. In particular, where the imprint mold 40 is separated from the imprint resin film 23 by the latter method, the linear fine convex pattern 22 with a highly accurate length in the longitudinal direction (line length) can be formed. Where the fine convex pattern 22 has a linear shape, it is most preferred than the direction of separation of the imprint mold 40 intersect the line direction of the fine convex pattern 22, but the imprint mold 40 may be also separated along the line direction or the imprint mold 40 may be separated along the direction having components of the line direction and a direction intersecting the line direction, provided that the shape change of the fine convex pattern 22 occurring during separation along the line direction is within the allowed range.

In addition to the above-described methods, a method by which a resin sheet 25 constituted by the abovementioned resin material is transported in one direction X, the rotation of a belt-shaped imprint mold 401 or a cylindrical imprint mold 402 is synchronized with the transportation of the resin sheet 25, and the belt-shaped imprint mold 401 or the cylindrical imprint mold 402 is continuously brought into contact with the resin sheet 25 can be also used for causing the fine convex pattern 22 to project in the direction ID inclined with respect to the direction CD perpendicular to the flat portion 21 (see FIGS. 4(a) and 4(b)). When the fine convex pattern structure 20 having the linear fine convex pattern 22 is produced by the method shown in FIGS. 4(a) and 4(b) and the line direction of the linear fine convex pattern 22 crosses (substantially perpendicular to) the transportation direction X of the resin sheet 25, it is possible to form the fine convex pattern 22 projecting in the direction ID inclined with respect to the direction CD perpendicular to the flat portion 21.

In the case in which the fine convex pattern 22 projecting in the inclined direction ID is formed under the condition such that the fine convex pattern 22 projects in the direction ID inclined with respect to the direction CD perpendicular to the flat portion 21, the dimensions and aspect ratio of the fine convex pattern 22 are not particularly limited, provided that they ensure that the fine convex pattern 22 can be caused by the above-described methods to project in the inclined direction ID, the specific dimensions and aspect ratio depending on the type of the resin material constituting the fine convex pattern 22 and the shape (linear, pillar-shaped, cross-shaped, L-shaped, etc.) of the fine convex pattern 22. However, in the second embodiment, since the fine convex pattern 22 projecting in the inclined direction ID is caused to project in the substantially perpendicular direction by shrinking the resin material constituting the fine convex pattern 22, as will be described hereinbelow, the dimensions and aspect ratio of the fine convex pattern 22 projecting in the substantially perpendicular direction change from the designed dimensions and aspect ratio. The amount of change of the dimensions and aspect ratio is determined by the shrinkage ratio of the resin material constituting the fine convex pattern 22. Therefore, the dimensions and aspect ratio of the fine convex pattern 22 projecting in the inclined direction ID can be set, as appropriate, according to the allowed range of the amount of change of the dimensions and aspect ratio of the fine convex pattern 22.

Further, although the dimensions and/or aspect ratio of fine convex pattern 22, which is to be formed, also depend on the type of the resin material constituting the imprint resin film 23 and the shape (linear, pillar-shaped, cross-shaped, L-shaped, etc.) of the fine convex pattern 22 in the fine convex pattern structure 20 which is planned for production, where the dimensions and/or aspect ratio are such that the fine convex pattern 22 is inclined with respect to the direction CD perpendicular to the flat portion 21 when the imprint mold 40 is pulled up for separation in the direction CD perpendicular to the flat portion 21, the fine convex pattern 22 can be caused to project in the direction ID inclined with respect to the direction CD perpendicular to the flat portion 21 by pulling up the imprint mold 40 for separation in the direction CD perpendicular to the flat portion 21.

For example, when the fine convex pattern structure 20 having the pillar-shaped fine convex pattern 22 is produced, the fine convex pattern 22 projecting in the inclined direction ID can be formed regardless of the method for separating the imprint mold 40 when the size of the fine convex pattern 22 is about equal to or less than 1.0 µm and the aspect ratio thereof is about equal to or greater than 1.5.

The specified dimension (about equal to or less than 1.0 µm) of the fine convex pattern 22 mentioned hereinabove is only an example of specified dimensions that make it possible to form the fine convex pattern 22 projecting in the inclined direction ID when the cylindrical pillar-shaped fine convex pattern 22 with an aspect ratio of 1.5 is to be formed by using the resin material such as described hereinabove, and the fine convex pattern 22 projecting in the inclined direction ID can be formed even when the dimension of 1.0 µm is exceeded. The same is true with respect to the specified value (about equal to or greater than 1.5) of aspect ratio, and the fine convex pattern 22 projecting in the inclined direction ID can be also formed when the aspect ratio is less than 1.5 correspondingly to the structure of the fine convex pattern 22 (cylindrical pillar-shaped, polygonal pillar-shaped, linear, L-shaped, cross-shaped, etc.) and the type of the resin material.

Similarly to the first embodiment, in the second embodiment, where a plurality of fine convex patterns 22 is included in the fine convex pattern structure 20 when the fine convex pattern 22 is formed that projects in the direction ID inclined with respect to the direction CD perpendicular to the flat portion 21, all of the fine convex patterns 22 may be caused to project in the inclined direction ID or only some of the fine convex patterns 22 may be caused to project in the inclined direction ID.

Then, energy is imparted from the outside to at least the (surface of the) fine convex pattern 22 (see FIG. 7(d)). Since the fine convex pattern 22 is constituted by a resin material that can be shrunk by the energy imparted from the outside, with the method for producing a fine convex pattern structure according to the second embodiment, it is possible to cause the inclined fine convex pattern 22 to project in the direction substantially perpendicular to the flat portion 21 by using the shrinkage force of the fine convex pattern 22 created by the energy imparted from the outside, and it is possible to produce the fine convex pattern structure 20 having the flat portion 21 and the fine convex pattern 22 projecting in the direction substantially perpendicular to the flat portion 21 (see FIG. 7(e)).

For example, a method for imparting the energy to the fine convex pattern 22 includes using an active energy beam irradiation device (a charged particle beam irradiation device such as an electron beam irradiation device and an ion beam irradiation device; an optical beam irradiation device such as a UV radiation irradiation device, an IR radiation irradiation device, a visible light beam irradiation device, and a laser beam irradiation device; and a radiation irradiation device such as an X-ray irradiation device and a gamma radiation irradiation device) and irradiating the fine convex pattern 22 with an active energy beam (a charged particle beam such as an electron beam and an ion beam; an optical beam such as UV radiation, IR radiation, visible light radiation, and laser beam; a radiation beam such as an X-ray beam and gamma radiation) 25.

The type of the active energy beam 26 to be used for irradiating the fine convex pattern 22 can be selected, as appropriate, according to the type of the resin material constituting the fine convex pattern 22. For example, when the resin material constituting the fine convex pattern 22 is a photocurable resin and the photocurable resin is shrunk using crosslinking (polymerization) reaction, since the photocurable resin shrinks under irradiation with an active energy beam with a wavelength equal to or less than 400 nm, it is necessary to perform irradiation with an active energy beam having such a wavelength. In this case, where UV radiation is selected as the active energy beam, since the polymerization initiator contained in the photocurable resin has a maximum absorption wavelength, where the irradiation is performed with the UV radiation having a peak wavelength conforming to the maximum absorption wavelength, the fine convex pattern 22 shrinks over a short period of time. Therefore, it is necessary to control stringently the irradiation amount of the UV radiation so as to prevent the fine convex pattern 22 from over-shrinkage. Thus, the energy to be used should be selected from the standpoint of controllability.

The type of the active energy beam 26 can be also selected, as appropriate, according to the type of material constituting the fine convex pattern 22. For example, when an optical beam with a wavelength equal to or less than 400 nm is selected as the active energy beam 26 (when an optical beam irradiation device is selected as the active energy beam irradiation device), the effect demonstrated in the second embodiment depends on the thickness and physical properties of the resin constituting the fine convex pattern 22. More specifically, a resin curing mode differs between the case in which the fine convex pattern 22 constituted by a resin with a transmissivity equal to or less than 30% with respect to the wavelength of the light used is irradiated with an optical beam and the case in which the fine convex pattern 22 constituted by a resin with a transmissivity equal to or greater than 90% is irradiated with the optical beam. In the fine convex pattern 22 constituted by a resin with a transmissivity equal to or less than 30%, the shrinkage is greater on the surface irradiated with the optical beam, whereas in the fine convex pattern 22 constituted by a resin with a transmissivity equal to or greater than 90%, the entire pattern shrinks substantially uniformly. Because of such a difference in optical beam transmissivity in the resin material, in the fine convex pattern 22 constituted by the resin material with a high optical beam transmissivity (for example, 90%), the entire fine convex pattern 22 shrinks substantially uniformly, and therefore, it is difficult to cause the fine convex pattern 22 to project in the direction substantially perpendicular to the flat portion 21. However, in the fine convex pattern 22 constituted by the resin material with a low optical beam transmissivity (for example, 30%), the fine convex pattern 22 can be easily caused to project in the direction substantially perpendicular to the flat portion 21. Further, when the fine convex pattern 22 is caused to project in the direction substantially perpendicular to the flat portion 21 by irradiation with an optical beam, it is possible that the resin material will be additionally shrunk by the light reflected from the substrate 24. Therefore, when the fine convex pattern 22 is to be caused to project in the direction substantially perpendicular to the flat portion 21 by irradiation with an optical beam, it is desirable to take into account the physical properties of the optical system such as the direction from which the fine convex pattern 22 is irradiated with the optical beam and the scattered light, and also the transmissivity (absorption ratio) of the resin material constituting the fine convex pattern 22 and the reactivity thereof to the wavelength.

Meanwhile, when an electron beam is used as the active energy beam 26 (when an electron beam irradiation device is selected as the active energy beam irradiation device), the energy is easily consumed in the vicinity of the resin surface facing in the irradiation direction. Therefore, the resin surface (surface irradiated by the electron beam) can be changed significantly and the fine convex pattern 22 can be caused to project in the direction substantially perpendicular to the flat portion 21. It is also preferred that the electron beam irradiation conditions be also selected as appropriate. For example, where the fine convex pattern 22 with a thickness equal to or less than 20 nm, when viewed from the electron beam irradiation source in the irradiation direction, is irradiated with an electron beam generated under a low accelerating voltage of about 0.1 kV to 10 kV, the resin material constituting the surface irradiated by the electron beam, from among the side surfaces of the fine convex pattern 22, can be shrunk more effectively, but the resin material constituting the side surface (surface not irradiated with the electron beam) on the side opposite that of the surface of the fine convex pattern 22 irradiated by the electron beam is practically not shrunk. Therefore, the fine convex pattern 22 can be caused to project in the direction substantially perpendicular to the flat portion 21. As a result, when the resin material is to be shrunk by irradiation with an electron beam, it is desirable that the accelerating voltage in the electron beam irradiation device be set, as appropriate, according to the thickness of the resin in the fine convex pattern 22, as viewed from the electron beam irradiation source in the irradiation direction.

In the second embodiment, the side surface (in the example shown in FIG. 7, the side surface on the left side in the side surface view) 22a of the fine convex pattern 22 opposing the inclination direction (in the example shown in FIG. 7, the direction to the right), from among the side surfaces of the inclined fine convex pattern 22, is relatively extended, whereas the side surface (in the example shown in FIG. 7, the side surface of the right side in the side surface view) 22b on the side in the inclination direction is relatively shrunk.

Therefore, where the energy is imparted to the fine convex pattern 22 in the second embodiment, the energy is imparted to the fine convex pattern 22 such that the amount of energy imparted to the relatively extended side surface 22a, from among the side surfaces of the inclined fine convex pattern 22, is increased. By increasing the amount of energy imparted to the relatively extended side surface 22a, it is possible to increase the shrinkage amount of the relatively extended side surface 22a over that of the relatively shrunk side surface 22b. As a result, the fine convex pattern 22 can be caused to project in the direction substantially perpendicular to the flat portion 21.

More specifically, it is desirable that the relatively extended side surface 22a in the inclined fine convex pattern 22 be preferentially irradiated with the active energy beam (electron beam, ion beam, UV radiation, IR radiation, visible light radiation, laser beam, X rays, gamma radiation) 26. Therefore, it is preferred that the arrangement position of the active energy source (electron gun or ion gun; light source of UV radiation, IR radiation, visible light radiation, or laser beam; irradiation source of X rays or gamma radiation) be set and the irradiation direction of the active energy beam be set with consideration for the inclination direction and inclination angle of the fine convex pattern 22 and the spacing between the adjacent fine convex patterns 22.

For example, by performing the irradiation with the active energy beam 26 from above the fine convex pattern structure 20 in the direction CD perpendicular to the flat portion 21, as shown in FIG. 7(*d*), it is possible to irradiate the side surface 22a of the fine convex pattern 22 efficiently with the active energy beam 26. Meanwhile, the side surface 22b of the fine convex pattern 22 is unlikely to be irradiated with the active energy beam 26. Therefore, the amount of energy imparted to the side surface 22a can be increased over that imparted to the side surface 22b of the fine convex pattern 22. As a result, the amount of shrinkage of the fine convex pattern 22 on the side surface 22a becomes larger than that on the side surface 22b. Therefore, it is possible to produce the fine convex pattern structure 20 having the fine convex pattern 22 projecting in the direction substantially perpendicular to the flat portion 21, as shown in FIG. 7(*e*).

In the above-described step for irradiating with the active energy beam (FIG. 7(*d*)), the irradiation direction of the active energy beam 26 may be set such as to ensure more efficient irradiation of the side surface 22a of the fine convex pattern 22 with the active energy beam 26 with consideration for the inclination angle of the fine convex pattern 22 and the spacing between the adjacent fine convex patterns 22.

Figure 8:
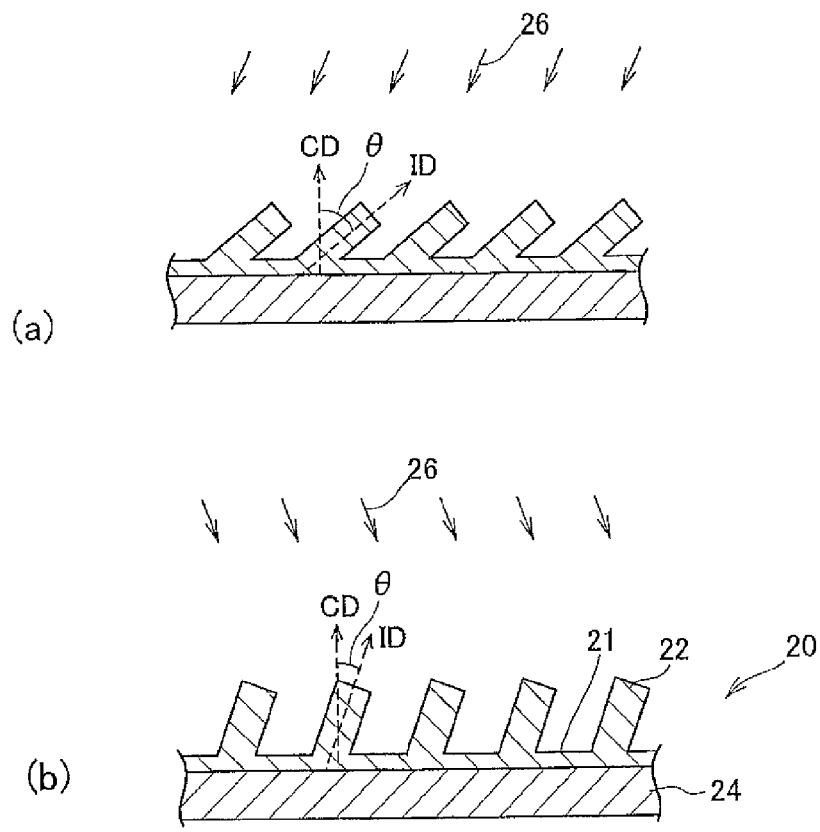
FIG. 8 is a cut end surface view showing the preferred example of a step for irradiating with an active energy beam in the second embodiment of the present invention.

For example, it is preferred that the irradiation direction of the active energy beam 26 be set in the direction from left downward when the fine convex pattern 22 is inclined toward the right side, in the side surface view of the fine convex pattern structure 20, the inclination (the angle θ formed by the inclination direction ID of the fine convex pattern 22 with the direction CD perpendicular to the flat portion 21) of the fine convex pattern 22 is large, and part of the side surface 22a of the fine convex pattern 22 is hidden by the adjacent fine convex pattern 22 in the top surface view of the fine convex pattern structure 20 (see FIG. 8(*a*)).

Further, it is preferred that the irradiation direction of the active energy beam 26 be set in the direction from right downward when the inclination (the angle θ formed by the inclination direction ID of the fine convex pattern 22 with the direction CD perpendicular to the flat portion 21) of the fine convex pattern 22 is small, and the side surface 22a of one fine convex pattern 22 is entirely exposed in the top surface view of the fine convex pattern structure 20 (see FIG. 8(*b*)).

Depending on the separation method of the imprint mold 40, the inclination direction ID of the fine convex patterns 22 is not necessary always the same direction, and the fine convex patterns 22 can be inclined in various directions. In such a case, it is preferred that the irradiation with the active energy beam 26 be performed from above the fine convex pattern structure 20 along the direction CD perpendicular to the flat portion 21 (see FIG. 7(*d*)).

It is also possible to divide the fine convex pattern structure 20 into a plurality of regions on the basis of the inclination direction ID of the fine convex pattern 22, set the irradiation direction of the active energy beam 26 according to the inclination direction ID of the fine convex pattern 22 in each region, and perform the irradiation with the active energy beam 26 from the direction that has been set for each divided region. As a result, the side surfaces 22a of all of the fine convex patterns 22 in the fine convex pattern structure 20 can be effectively irradiated with the active energy beam 26, and the fine convex pattern structure 20 having the fine convex pattern 22 projecting in the direction substantially perpendicular to the flat portions 21 can be produced with good accuracy.

In the second embodiment, the shrinkage of the fine convex pattern 22 caused by the imparted energy is apparently induced by at least one of the following mechanisms: shrinkage caused by changes in the chemical structure of the resin material constituting the fine convex pattern 22 and shrinkage caused by the heat generated by the energy imparted to the fine convex pattern 22.

Among those mechanisms, the examples of the shrinkage caused by changes in the chemical structure of the resin material include: the shrinkage caused by the advance of the crosslinking (polymerization) reaction of the resin material constituting the fine convex pattern 22; the shrinkage caused by densification of the resin material in the fine convex pattern 22 due to the formation of a straight-chain structure by ring opening of a cyclic structure when the resin material constituting the fine convex pattern 22 has the cyclic structure; the shrinkage occurring when the molecular chains of the resin material constituting the fine convex pattern 22 are cut and some molecules are detached at a level such that no adverse effect is produced on the structure of the fine convex pattern 22 (the fine convex pattern 22 is not damaged); and the shrinkage occurring when the molecular chains of the resin material that have been extended by a force (pressure) applied from the outside of the fine convex pattern 22 are moved by the imparted energy through a distance at which they are in a mutually stable state. It can be assumed that the fine convex pattern 22 is shrunk by at least one of those mechanisms.

Therefore, for example, when the resin material constituting the fine convex pattern 22 is curable by an active energy beam, the side surface 22a of the fine convex pattern 22 is irradiated with the active energy beam 26 having an energy intensity such that can advance the crosslinking (polymerization) reaction of the resin curable by an active energy beam, but cannot cut the molecular chains. As a result, the crosslinking (polymerization) reaction of the resin curable by an active energy beam in the vicinity of the portion (side surface 22a) irradiated by the active energy beam 26 is advanced and the vicinity of the side surface 22a of the fine convex pattern 22 is further shrunk. As a result, the inclined fine convex pattern 22 can be caused to project in the direction substantially perpendicular to the flat portion 21.

When the resin material constituting the fine convex pattern 22 has a cyclic structure, the side surface 22a of the fine convex pattern 22 is irradiated with the active energy beam 26 having an energy intensity such that the ring-opening reaction of the cyclic structure can be advanced. As a result, the ring-opening reaction of the resin material in the vicinity of the portion (side surface 22a) irradiated with the active energy beam 26 is advanced and the cyclic structure is changed into a straight-chain structure, whereby the density of the resin material in the vicinity of the side surface 22a is increased. Therefore, the vicinity of the side surface 22a of the fine convex pattern 22 can be further shrunk and the inclined fine convex pattern 22 can be caused to project in the direction substantially perpendicular to the flat portions 21.

The side surface 22a of the fine convex pattern 22 is also irradiated with the active energy beam 26 having an energy intensity such that the molecular chains of the resin material constituting the fine convex pattern 22 can be cut and some of the molecules can be detached. As a result, the molecular chains of the resin material in the vicinity of the portion (side surface 22a) irradiated with the active energy beam 26 are cut, some of the molecules are detached, and the vicinity of the side surface 22a of the fine convex pattern 22 is further shrunk. As a consequence, the inclined fine convex pattern 22 can be caused to project in the direction substantially perpendicular to the flat portion 21.

Further, the vicinity of the irradiated portion (side surface 22a) is also heated as a result of the active energy beam 26 being radiated toward the side surface 22a of the fine convex pattern 22. The vicinity of the side surface 22a of the fine convex pattern 22 can thus be thermally shrunk, thereby making it possible to cause the inclined fine convex pattern 22 to project in the direction substantially perpendicular to the flat portion 21.

In the second embodiment, the fine convex pattern 22 may be continuously irradiated with the active energy beam 26, but pulsed irradiation with the active energy beam 26 is preferred because excessive energy can be prevented from being imparted to the fine convex pattern 22 in the fine convex pattern structure 20. Where excessive energy is imparted to the fine convex pattern 22, portions other than the portion (side surface 22a of the fine convex pattern 22) which is mainly wished to be shrunk are also contacted. As a result, the fine convex pattern structure 20 can be deformed.

In this case, active energy beam irradiation conditions including the pulse width and pulse rest time of the active energy beam irradiation may be set, as appropriate, according to the type of the resin material constituting the fine convex pattern structure 20, dimensions and aspect ratio of the fine convex pattern 22, and inclination angle of the fine convex pattern 22, the setting making it possible to correct the inclination of the fine convex pattern 22 and prevent the fine convex pattern structure 20 from deformation.

Figure 9:
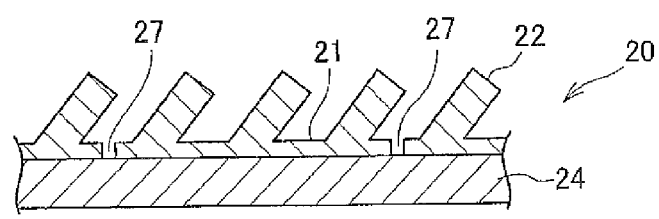
FIG. 9 is a cut end surface view showing another example of the fine convex pattern structure having an inclined fine convex pattern which is produced in the second embodiment of the present invention.

Even when the irradiation with the active energy beam 26 is preferentially performed on the relatively extended side surface 22a from among the side surfaces of the fine convex pattern 22, portions (other side surfaces, flat portion 21, substrate 24, and the like) other than the side surface 22a are also irradiated with the active energy beam 26, or the energy is also imparted to the portions other than the side surface 22a by energy propagation from the side surface 22a. In such cases, the fine convex pattern structure 20 is entirely shrunk in the case of the fine convex pattern structure 20 in which the flat portion 21 and the fine convex pattern 22 are constituted by a resin material, but because of the difference in shrinkage ratio between the resin material constituting the fine convex pattern structure 20 and the material constituting the substrate 24, the substrate 24 can be deformed by warping following the shrinkage of the entire fine convex pattern structure 20. Therefore, in order to prevent such a situation, it is preferred that the occurrence of energy propagation be inhibited by forming a slit 27 in the flat portion 21 when the fine convex pattern structure 20 is produced, as shown in FIG. 9, or by providing a layer capable of blocking the propagation of energy by thermal insulation, electric insulation, or absorption between the fine convex pattern structure 20 and the substrate 24.

The method for producing a fine convex pattern structure according to the above-described second embodiment is particularly advantageous in the production of a cell culturing sheet having a nano-pillar array structure, a film (moth eye film) having a moth eye structure (a structure simulating a moth eye pattern, that is, a structure having arranged therein a fine convex pattern of an order of several tens to several hundreds of nanometers), and a polarization film (a film that controls the light oscillation direction, for example, a film constituted by a line-and-space pattern in a specific direction, the pattern being disposed, as appropriate, with respect to the light incidence direction, thereby selectively blocking and transmitting the light).

Where a cell culturing sheet having a nano-pillar array structure is produced according to the second embodiment, the imprint mold 40 having a nano-hole array corresponding to the nano-pillar array structure is pressed into the imprint resin film 23 (see FIG. 7(b)). Then, a cell culturing sheet in which the nano-pillar array structure (fine convex pattern 22) projects in the direction substantially perpendicular to the flat portion 21 can be produced by implementing the steps shown in FIGS. 7(c) to 7(e). When the cell culturing sheet having the nano-pillar array structure is used, the cells are brought into contact with the fine convex pattern 22. Therefore, in some cases it is undesirable to form a mold release agent layer on the imprint mold 40. This is because the mold release agent layer can poison the cells. Therefore, a large stress is applied when the imprint mold 40 is separated from the imprint resin film 23. Thus, the stress occurring during the separation of the imprint mold 40 can be reduced by producing the cell culturing sheet having the nano-pillar array structure according to the second embodiment.

When a moth eye film is produced according to the second embodiment, first, the surface of an aluminum base material is anodized to form the aluminum base material having a plurality of fine concave portions and, if desired, the plurality of fine concave portions is expanded by etching the aluminum base material. The aluminum base material having the plurality of fine concave portions, which has thus been formed, is used as an imprint mold and the aluminum base material is pressed into an imprint resin film. In this case, typically, as shown in FIGS. 4(a) and 4(b), the aluminum base material is used in the form of the belt-shaped imprint mold 401 or the cylindrical imprint mold 402, and the belt-shaped or cylindrical imprint mold 401, 402 is continuously brought into contact with the resin sheet 25. Then, a moth eye film in which the fine convex pattern 22 projects in the direction substantially perpendicular to the flat portion 21 can be produced by implementing the steps shown in FIGS. 7(c) to 7(e). The belt-shaped or cylindrical imprint mold 401, 402 enables mass production of the moth eye film by continuous contact with the resin sheet 25, but in such a process, the separation ability of the belt-shaped or cylindrical imprint mold 401, 402 can be gradually degraded. However, according to the second embodiment, the moth eye film in which the fine convex pattern 22 projects in the direction substantially perpendicular to the flat portion 21 can be produced with a high accuracy even in such a case. A polarization film can be also produced, for example, by using a mold having the line-and-space structure and implementing the steps same as those in the production of the moth eye film.

As indicated hereinabove, with the method for producing a fine convex pattern structure according to the second embodiment, the fine convex pattern 22 can be formed under the condition such that the fine convex pattern 22 projects in the inclined direction. Therefore, when the imprint mold 40 is separated from the imprint resin film 23, the occurrence of defects such as cracks in the fine convex pattern 22 can be inhibited. In addition, since the fine convex pattern 22 can be caused to project in the direction substantially perpendicular to the flat portion 21 by imparting the energy from the outside to the relatively extended side surface 22a of the inclined fine convex pattern 22 and using the shrinkage force of the resin material constituting the fine convex pattern 22, the fine convex pattern structure 20 having the fine convex pattern 22 projecting substantially perpendicular to the flat portion 21 can be produced with a good accuracy.

Further, with the method for producing the fine convex pattern structure according to the second embodiment, since the inclined fine convex pattern 22 can be caused to project in the direction substantially perpendicular to the flat portion 21, it is possible to produce with a good accuracy even the fine convex pattern structure 20 having the fine convex pattern 22 with fine dimensions and a high aspect ratio that could not be formed by the conventional nanoimprinting technique due to the tumbling of the pattern.

[System for Producing Fine Convex Pattern Structure]

Figure 10:
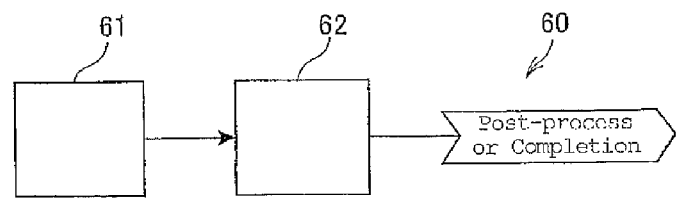
FIG. 10 is a block diagram illustrating a schematic configuration of a system for producing a fine convex pattern structure in the second embodiment of the present invention.

A system capable of implementing the method for producing the above-described fine convex pattern structure according to the second embodiment is explained below. FIG. 10 is a block diagram illustrating the schematic configuration of the system for producing the fine convex pattern structure according to the second embodiment.

As shown in FIG. 10, a system 60 for producing the fine convex pattern structure according to the second embodiment includes an inclined pattern formation unit 61 that produces the fine convex pattern structure 20 having the flat portion 21 and the fine convex pattern 22 projecting from the flat portion 21 under the condition such that the fine convex pattern 22 projects in the direction ID inclined with respect to the direction CD perpendicular to the flat portion 21, and an energy imparting unit 62 that causes the inclined fine convex pattern 22 to project in the direction substantially perpendicular to the flat portion 21 by imparting the energy from the outside to the fine convex pattern 22 in the fine convex pattern structure 20 produced with the inclined pattern formation unit 61.

The inclined pattern formation unit 61 is constituted by a single device or a plurality of device groups that are typically used for producing the fine convex pattern structure 20. A specific device configuration is similar to that of the inclined pattern formation unit 51 in the first embodiment.

The configuration of the energy imparting unit 62 is not particularly limited, provided that the energy can be imparted to the side surface 22a of the fine convex pattern 22 in the fine convex pattern structure 20 and the resin material in the side surface 22a can be shrunk. For example, an active energy beam irradiation device, such as an electron beam irradiation device, an ion beam irradiation device, a UV radiation irradiation device, an IR radiation irradiation device, a visible light beam irradiation device, a laser beam irradiation device, an X-ray irradiation device and a gamma radiation irradiation device can be used.

In the system 60 for producing the fine convex pattern structure having the above-described configuration, the fine convex pattern structure 20 having the inclined fine convex pattern 22 is produced in the inclined pattern formation unit 61, and the energy is imparted to the side surface 22a of the inclined fine convex pattern 22 in the energy imparting unit 62. As a result, it is possible to produce the fine convex pattern structure 20 having the flat portion 21 and the fine convex pattern 22 projecting in the direction substantially perpendicular to the flat portion 21.

Thus, with the system 60 for producing the fine convex pattern structure of the second embodiment, by producing the fine convex pattern structure 20 in the inclined pattern formation unit 61 under the condition such that the fine convex pattern 22 is inclined, it is possible to inhibit the occurrence of defects such as cracks in the fine convex pattern 22. Further, since the inclined fine convex pattern 22 can be caused to project in the direction substantially perpendicular to the flat portion 21 in the energy imparting unit 62, it is possible to produce with a good accuracy the fine convex pattern structure 20 having the fine convex pattern 22 projecting in the direction substantially perpendicular to the flat portion 21.

Further, with the system for producing the fine convex pattern structure according to the second embodiment, since the inclined fine convex pattern 22 can be caused to project in the direction substantially perpendicular to the flat portion 21, it is possible to produce with a good accuracy even the fine convex pattern structure 20 having the fine convex pattern 22 with fine dimensions and a high aspect ratio that could not be formed by the conventional nanoimprinting technique due to the tumbling of the pattern.

The above-described embodiments are presented to facilitate the understanding of the present invention and are not intended to restrict the present invention. Therefore, the elements disclosed in the embodiment also include all of the design changes and equivalents belonging to the technical scope of the present invention.

In the first embodiment, the electric changes are induced in the entire fine convex pattern structure 10, but the present invention is not limited to such a mode, and it is also possible to include the electric changes only in a partial region of the fine convex pattern structure 10 and cause the inclined fine convex pattern 12 to project in the direction substantially perpendicular to the flat portion 11 in this region.

In such a mode, the fine convex pattern structure 10 may be produced under the condition such that only the fine convex pattern 12 in the partial region of the fine convex pattern structure 10 projects in the inclined direction ID and the electric charges may be induced only in this partial region.

Figure 11:
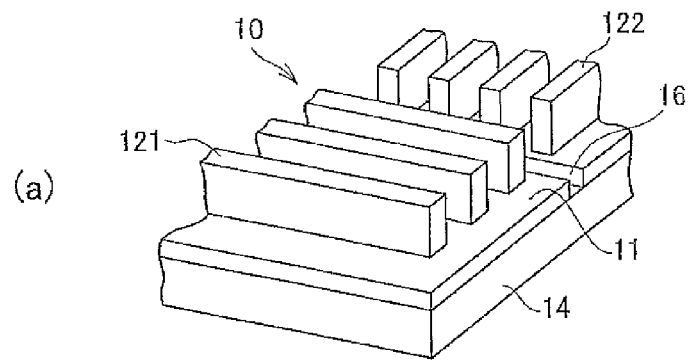
FIG. 11 is a perspective view showing another example (variant 2) of the fine convex pattern structure having the inclined fine convex pattern which is produced in the first embodiment of the present invention.
Figure 11:
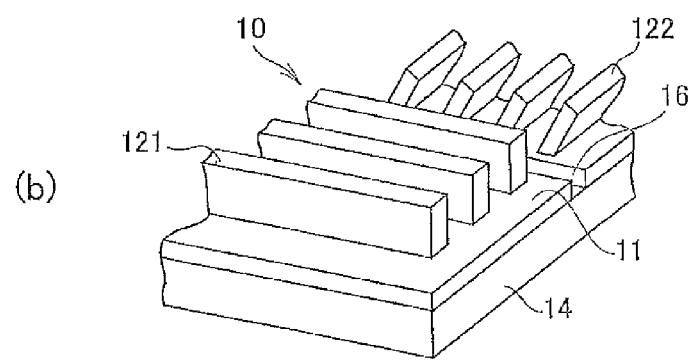

For example, the fine convex pattern structure 10 (flat portion 11 and fine convex patterns 121, 122), which is to be produced, is constituted by an electrically conductive polymer, the fine convex pattern structure 10 is provided on an electrically insulating substrate 14 such as a glass substrate, and the first linear fine convex pattern 121 extending in one direction and the second linear fine convex pattern 122 extending in a direction different form the one direction are included in the same plane (see FIG. 11(a)). In this case, where the production is performed by separating the imprint mold 30 along the line direction of the first fine convex pattern 121, the first fine convex pattern 121 projects in the direction substantially perpendicular to the flat portion 11, but the second fine convex pattern 122 projects in the direction inclined with respect to the direction substantially perpendicular to the flat portion 11 (see FIG. 11(b)). As a result, at least the second fine convex pattern 122 is formed to have a highly accurate line length. Meanwhile, the second fine convex pattern 122 projects in the direction inclined with respect to the direction substantially perpendicular to the flat portion 11, but by splitting the region where the first fine convex pattern 121 has been formed and the region where the second fine convex pattern 122 has been formed by a slit 16 and grounding the region where the first fine convex pattern 121 has been formed, it is possible to induce electric charges only in the region where the second fine convex pattern 122 has been formed and cause the inclined second fine convex pattern 122 to project in the direction substantially perpendicular to the flat portion 11 (see FIG. 11(a)).

Likewise, in the second embodiment, it is also possible to irradiate only the (side surface 22a of the) fine convex pattern 22 in a partial region of the fine convex pattern structure 20, thereby imparting the energy only to the fine convex pattern 22 in the partial region and causing the fine convex pattern 22 inclined in this region to project in the direction substantially perpendicular to the flat portion 21.

Further, the first and second embodiments may also additionally include a step of verifying whether or not the fine convex patterns 12, 22 have projected in the direction substantially perpendicular to the flat portions 11, 21 after the electric charges have been induced or the energy has been imparted to the inclined fine convex patterns 12, 22.

In this case, for example, an estimation method based on observations of shape and a method for determining the presence/absence of inclination on the basis of information obtained from a change in shape can be used for verifying whether or not the fine convex patterns 12, 22 have projected in the direction substantially perpendicular to the flat portions 11, 21.

More specifically, it is possible to capture the image of the fine convex pattern structures 10, 20 from the top or side surface thereof by using a laser microscope or a SEM and verify the presence/absence of inclination of the fine convex patterns 12, 22, or to bring a probe close to or into contact with the fine convex pattern structures 10, 20 by using an AFM or the like and verify the presence/absence of inclination of the fine convex patterns 12, 22. Where an optical microscope is used, the resolution in response to the fine convex patterns 12, 22 is insufficient and the fine convex patterns 12, 22 are difficult to distinguish. However, by comparing the images of the regions where the presence of the fine convex patterns 12, 22 projecting in the direction substantially perpendicular to the flat portions 11, 21 has been established or comparing such regions with the image captured with the same resolution, it is possible to verify the presence/absence of inclination of the fine convex patterns 12, 22 by the difference in contrast or in optical characteristics such as color tone between the images. The presence/absence of inclination of the fine convex patterns 12, 22 may be also verified on the basis of measurement data such as transmissivity, refractive index, and reflectance. A combination of the above-described methods may be also used. Further, in the second embodiment, where the energy is imparted to the fine convex pattern 22 by using a SEM or the like and irradiating the inclined fine convex pattern 22 with an electron beam, the presence/absence of inclination of the fine convex pattern 22 can be also verified while irradiating with the electron beam by using the SEM or the like.

In the first and second embodiments, the fine convex pattern structures 10, 20 having the fine convex patterns 12, 22 projecting in the direction substantially perpendicular to the flat portions 11, 21 are produced, but it is also possible to produce the fine convex pattern structures 10, 20 in which the projection angle of the fine convex patterns 12, 22 after the electric charges have been induced on, or the energy has been imparted to the fine convex pattern structures 10, 20 (the angle formed by a segment (axial line) passing through the center, in the width direction, of the fine convex patterns 12, 22 and the tangential line of the flat portion 11, 21 passing through the intersection point of the axial line and the flat portion 11, 21, in the side surface view of the fine convex pattern structures 10, 20 in which the fine convex patterns 12, 22 face upward and the flat portion 11, 21 face downward) is closer to the direction substantially perpendicular to the flat portions 11, 21 than the projection angle of the fine convex patterns 12, 22 when the imprint molds 30, 40 are separated from the imprint resin films 13, 23.

The first and second embodiments are explained on the basis of the methods for producing the fine convex pattern structures 10, 20 having the fine convex patterns 12, 22 projecting in the direction substantially perpendicular to the flat portions 11, 21, but the present invention can be also applied to a method for producing a fine convex pattern structure in which the fine convex pattern in the target fine convex pattern structure is inclined at a predetermined angle (projects in the inclined direction). In this case, it is possible to form a fine convex pattern such that is inclined to the flat portion side at an angle greater than the predetermined angle and then to cause the fine convex pattern to project at the predetermined angle by inducing the electric charges on the fine convex pattern or imparting the energy to the fine convex pattern.

For example, a method of using an imprint mold having a fine concave pattern, in which a side wall of the fine concave pattern is constituted by an inclined wall inclined at an angle corresponding to the inclination angle of the fine convex pattern, can be used as a method for forming the fine convex pattern inclined at a predetermined angle.

EXAMPLES

The present invention will be explained below in greater detail by examples thereof, but the present invention is not limited to the below-described examples.

Example 1

A plurality of linear fine convex patterns 12 (designed dimension: 100 nm, aspect ratio: 3.0, pitch between the adjacent fine convex patterns 12: 100 nm) was formed on one surface of the glass substrate 14 by using a UV-curable resin material and performing UV nanoimprinting using the imprint mold 30 having the fine concave pattern 32 corresponding to the fine convex pattern 12 which is to be formed, and the fine convex pattern structure 10 was produced. When the imprint mold 30 was separated, the separation of the imprint mold 30 was performed along the direction substantially perpendicular to the line direction (longitudinal direction) of the linear fine convex pattern 12.

Figure 13:
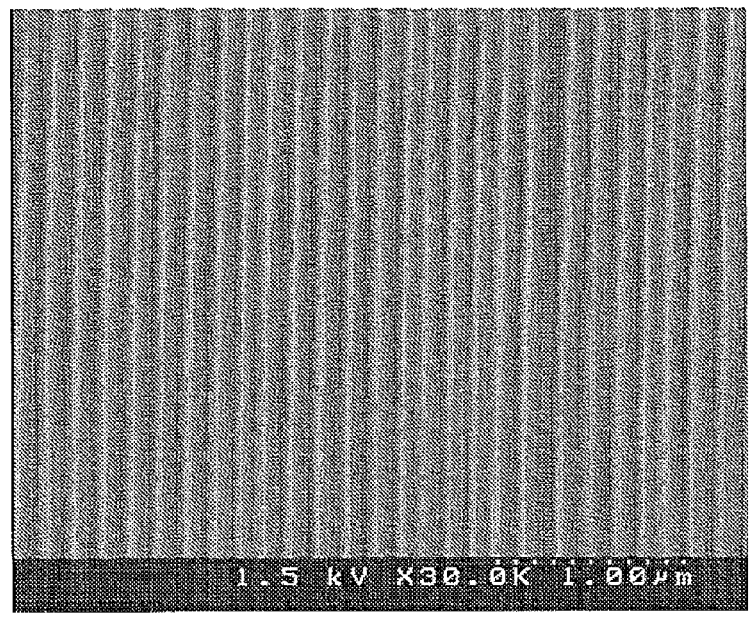
FIG. 13 is a SEM micrograph showing a fine convex pattern after the imprint mold has been separated in Example 1.

A total of five fine convex pattern structures 10 were fabricated in the above-described manner, and each fine convex pattern structure 10 was checked under a SEM. As shown in the SEM micrograph in FIG. 13, the fine convex patterns 12 in all of the fine convex pattern structures 10 were confirmed to be inclined to the left, that is, in the direction same as the separation direction.

Dry etching using ICP-RIE was performed with respect to the fine convex pattern structures 10 which have been fabricated in the above-described manner and in which the fine convex patterns 12 have been inclined. In such dry etching, initially a plasma atmosphere was formed at an ICP output such that the UV-curable resin and quartz were not etched (60% of the ICP output at which the target quartz etching rate could be obtained), the fine convex pattern structure 10 was allowed to be present under the plasma atmosphere for 10 sec, without applying a high-frequency current to the electrode on which the fine convex pattern structure 10 was placed, and the ICP output was then raised to the level at which the target quartz etching rate could be obtained.

Figure 14:
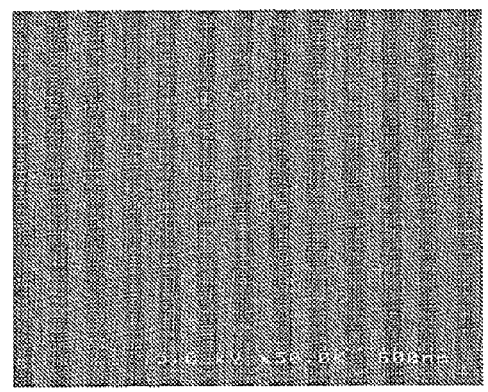
FIG. 14 is a SEM micrograph showing the substrate after the dry etching processing in Example 1.

The quartz substrate 14 subjected to dry etching in the above-described manner was observed under a SEM. As shown in the SEM micrograph in FIG. 14, it was confirmed that a vertical linear pattern was formed in which the inclination of the fine convex pattern 12 was not reflected.

Comparative Example 1

The fabricated fine convex pattern structure 10 was subjected to dry etching treatment by the same method as in Example 1, except that the ICP output was at a level at which the target quartz etching rate could be obtained throughout the entire dry etching treatment. The quartz substrate 14 that was dry etched in such a manner was observed under the SEM. It was configured that the quartz substrate 14 was dry etched in a state reflecting the inclination of the fine convex pattern 12.

As follows from the results obtained in Example 1 and Comparative Example 1, by lowering the ICP output to a level at which the UV-curable resin and quartz substrate 14 were not dry etched in the dry etching treatment, as in Example 1, the electric charges could be induced on the fine convex pattern structure 10 (fine convex pattern 12), thereby making it possible to cause the fine convex pattern 12 to project in the direction substantially perpendicular to the flat portion 11 by the generated electric repulsion force. This is supposedly why by raising the ICP output in this state and performing the dry etching treatment, it was possible to form a vertical linear pattern on the quartz substrate 14.

Test Example 1

Only one surface of a cycloolefin thermoplastic resin film (trade name: Zeonoa, manufactured by Nippon Zeon KK; size: square with a 10 mm side, thickness: 2.0 mm) was irradiated with an electron beam (accelerating voltage 800 V, electron beam integrated irradiation dose: 188.6 µC/cm$^2$), and the flatness (warping) of the film before and after the electron beam irradiation was measured with Flatmaster (Corning Co.). As a result, it was confirmed that the film warped in a manner such that the irradiated surface side was recessed after the electron beam irradiation. This result clearly indicates that the resin was shrunk on the electron beam irradiation surface of the resin film by electron beam irradiation.

Example 2

The fine convex pattern structure 20 having the pillar-shaped fine convex pattern 22 and the flat portion 21 was produced by heating a cycloolefin thermoplastic resin film (trade name: Zeonoa, manufactured by Nippon Zeon KK) to a predetermined temperature, pressing the imprint mold 40 having a hole-shaped fine convex pattern into the film, and then pulling up and separating the imprint mold 40 in the direction substantially orthogonal to the upper surface of the resin film. The fine convex pattern 22 in the fine convex pattern structure 20 was set to have a dimension of 250 nm, an aspect ratio of 2.0, and a spacing between the adjacent fine convex patterns 22 of 250 nm. The thickness of the resin film as 2.0 mm.

Figure 15:
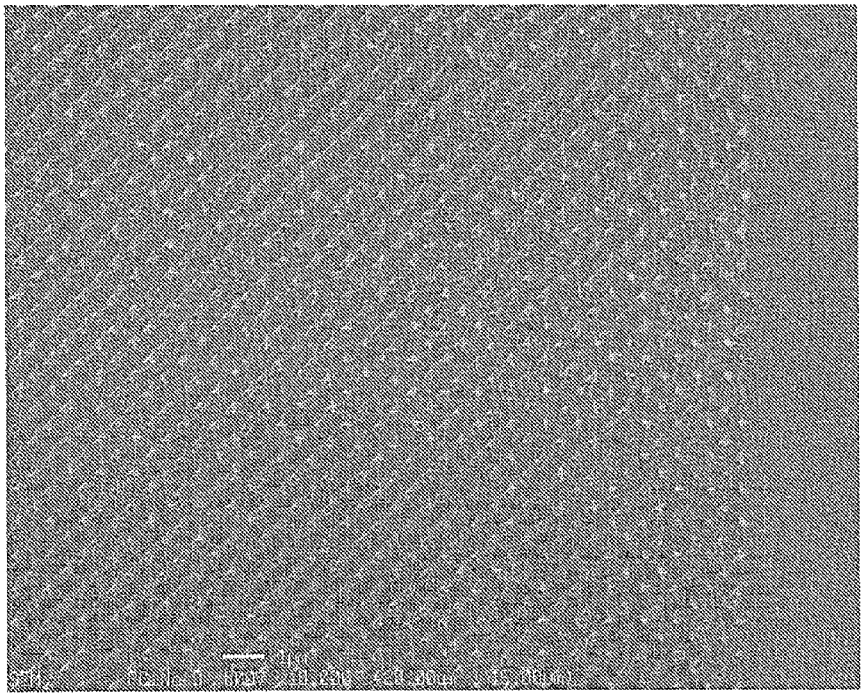
FIG. 15 is a SEM micrograph showing a fine convex pattern before electron beam irradiation in Example 2.
Figure 16:
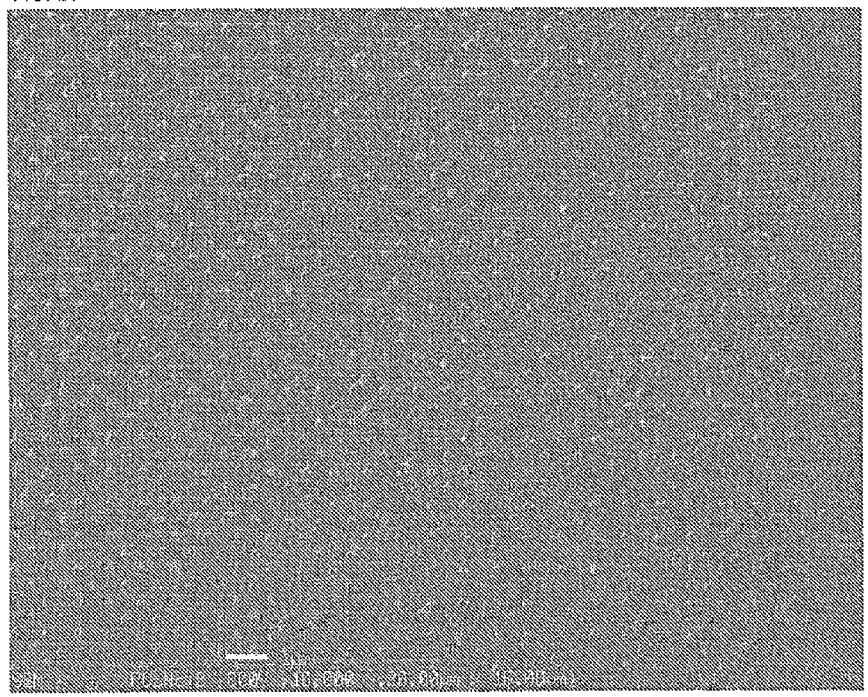
FIG. 16 is a SEM micrograph showing a fine convex pattern after electron beam irradiation in Example 2.

The fine convex pattern structure 20 produced in the above-described manner was observed under a SEM (JEOL, trade name JSM-7001F). As follows from the SEM micrograph shown in FIG. 15, the fine convex pattern 22 was confirmed to be inclined (electron beam irradiation dose 5.8 µC/cm$^2$). The fine convex pattern structure 20 was then continuously irradiated with the electron beam till the electron beam irradiation dose became 58.0 µC/cm$^2$ under an accelerating voltage of 800 V by using the SEM. As follows from the SEM micrograph in FIG. 16, the fine convex pattern 22 could be caused to project in the direction substantially perpendicular to the flat portion 21.

Example 3

The fine convex pattern structure 20 was produced in the same manner as in Example 2, except that the cycloolefin thermoplastic resin film was replaced with a polystyrene resin film.

Figure 17:
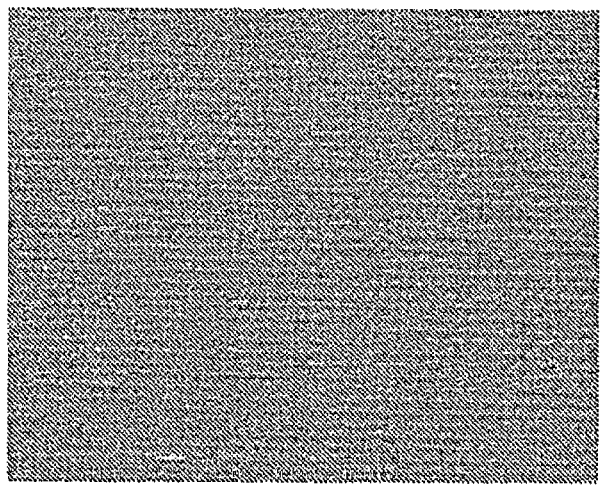
FIG. 17 is a SEM micrograph showing a fine convex pattern before electron beam irradiation in Example 3.
Figure 18:
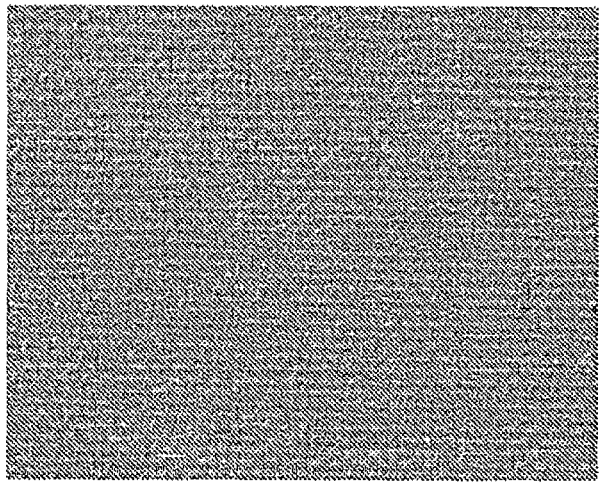
FIG. 18 is a SEM micrograph showing a fine convex pattern after electron beam irradiation in Example 3.

The fine convex pattern structure 20 produced in the above-described manner was observed under a SEM (JEOL, trade name JSM-7001). As follows from the SEM micrograph shown in FIG. 17, the fine convex pattern 22 was confirmed to be inclined (electron beam irradiation dose 5.8 µC/cm$^2$). The fine convex pattern structure 20 was then continuously irradiated with the electron beam till the electron beam irradiation dose became 63.8 µC/cm$^2$ under an accelerating voltage of 800 V by using the SEM. As follows from the SEM micrograph in FIG. 18, the fine convex pattern 22 could be caused to project in the direction substantially perpendicular to the flat portion 21.

Example 4

Figure 19:
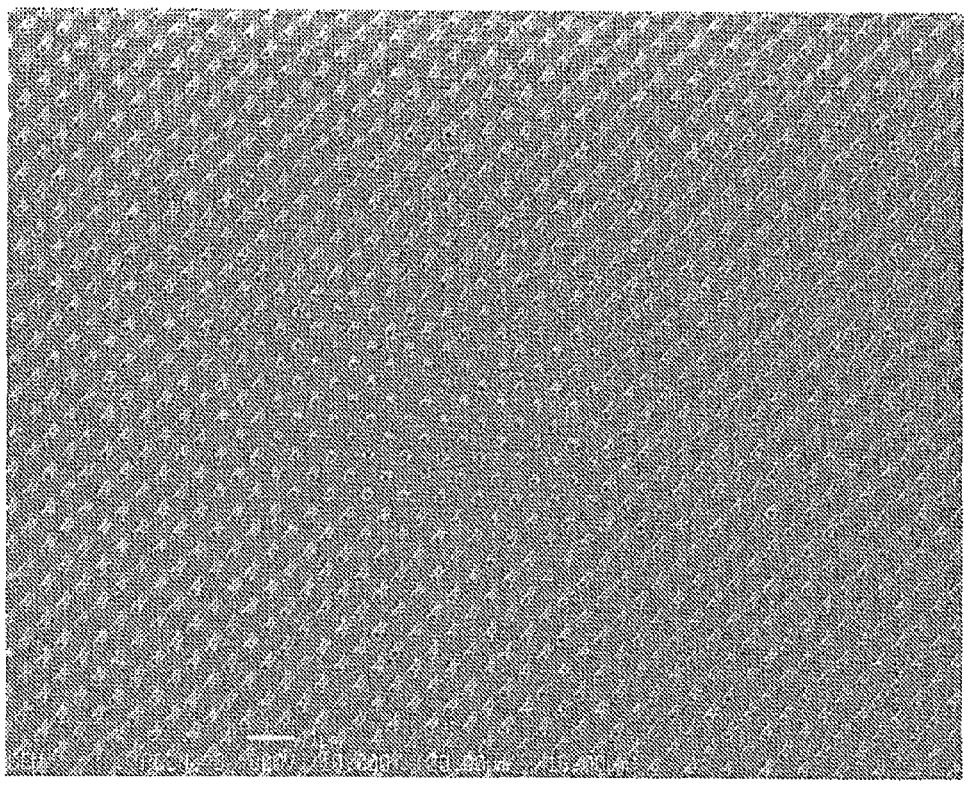
FIG. 19 is a SEM micrograph showing a fine convex pattern after electron beam irradiation in Example 4.

When only a partial region of the fine convex pattern structure 20 of Embodiment 2 was continuously irradiated with an electron beam integrated irradiation dose of 63.8 µC/cm$^2$ under an accelerating voltage of 800 V by using the SEM, it was possible, as follows from the SEM micrograph shown in FIG. 19, to cause only the fine convex pattern 22 within the region irradiated with the electron beam to project in the direction substantially perpendicular or the flat portion 21.

The results obtained in Example 4 indicate that by irradiating only the partial region of the fine convex pattern structure 20 with an electron beam, it is possible to cause only the fine convex pattern 22 within the partial region to project in the direction substantially perpendicular or the flat portion 21. Further, since only the fine convex pattern 22 in the portion irradiated with the electron beam could be caused to project in the direction substantially perpendicular or the flat portion 21, it can be assumed that the energy of the electron beam used for irradiation acted only in the irradiated region, without diffusing to the fine convex pattern structure 20 outside the irradiated region.

Thus, by combining the results obtained in the Test Example 1 and Examples 2 to 4, it can be supposed that when the fine convex pattern structure 20 having the inclined fine convex pattern 22 was irradiated with an electron beam, the relatively extended side surface in the inclined fine convex pattern 22 was preferentially irradiated with the electron beam, and the resin material of the side surface, which was preferentially irradiated with the electron beam, was shrunk to a greater degree under the action of the electron beam energy, which resulted in the projection of the fine convex pattern 22 in the direction substantially perpendicular or the flat portion 21.

INDUSTRIAL APPLICABILITY

The present invention is useful for producing a fine convex pattern structure by a nanoimprint method.

EXPLANATION OF REFERENCE NUMERALS 10, 20 . . . fine convex pattern structures
11, 21 . . . flat portions
12, 22 . . . fine convex patterns
30, 40, 301, 302, 401, 402 . . . imprint molds
32, 42 . . . fine convex patterns
50, 60 . . . systems for producing fine convex pattern structure
51, 61 . . . inclined pattern formation portions
52 . . . charge imparting unit
62 . . . energy imparting unit

The invention claimed is:

1. A method for producing a fine convex pattern structure having a flat portion and a fine convex pattern projecting from the flat portion in a predetermined direction with respect to the flat portion,
the method comprising:
using an imprint mold that has a fine concave pattern corresponding to the fine convex pattern, and forming the fine convex pattern projecting from the flat portion under a condition in which the fine convex pattern is inclined to the flat portion side from the predetermined direction; and
causing the fine convex pattern to project in the predetermined direction with respect to the flat portion by inducing electric charges at least on the inclined fine convex pattern.

2. The method for producing a fine convex pattern structure according to claim 1, wherein the electric charges are induced on the inclined fine convex pattern by placing the fine convex pattern structure under an atmosphere in which the fine convex pattern structure can be electrically charged.

3. The method for producing a fine convex pattern structure according to claim 1, wherein the electric charges are induced on the inclined fine convex pattern by dielectric polarization or electrostatic induction of at least the fine convex pattern.

4. The method for producing a fine convex pattern structure according to claim 1, wherein the fine convex pattern structure is constituted by an electrically insulating material.

5. The method for producing a fine convex pattern structure according to claim 1, wherein
the fine convex pattern structure is constituted by a material including an electrically conductive material; and
the electric charges are induced on the inclined fine convex pattern in an electrically floating state of at least the fine convex pattern.

6. A method for producing a fine convex pattern structure having a flat portion and a fine convex pattern projecting from the flat portion in a predetermined direction with respect to the flat portion, with at least the fine convex pattern being constituted by a resin material that can be shrunk by energy from outside,
the method comprising:
using an imprint mold having a fine concave pattern corresponding to the fine convex pattern, and forming the fine convex pattern projecting from the flat portion under a condition in which the fine convex pattern is inclined to the flat portion from the predetermined direction; and
causing the fine convex pattern to project in the predetermined direction with respect to the flat portion by imparting the energy from the outside to a relatively extended side surface from among side surfaces of the inclined fine convex pattern.

7. The method for producing a fine convex pattern structure according to claim 6, wherein, by irradiating the relatively extended side surface of the inclined fine convex pattern with an active energy beam, the relatively extended side surface of the fine convex pattern is shrunk.

8. The method for producing a fine convex pattern structure according to claim 7, wherein the relatively extended side surface of the fine convex pattern is shrunk by changing a chemical structure of the resin material in the relatively extended side surface of the fine convex pattern.

9. The method for producing a fine convex pattern structure according to claim 8, wherein the relatively extended side surface of the fine convex pattern is shrunk by promoting a crosslinking reaction of the resin material.

10. The method for producing a fine convex pattern structure according to claim 8, wherein the relatively extended side surface of the fine convex pattern is shrunk by cutting a molecular chain of the resin material.

11. The method for producing a fine convex pattern structure according to claim 7, wherein the relatively extended side surface of the fine convex pattern is thermally shrunk.

12. The method for producing a fine convex pattern structure according to claim 6, wherein the relatively extended side surface of the fine convex pattern is shrunk by irradiating the fine convex pattern structure with an electron beam, an ion beam, UV radiation, IR radiation, visible light radiation, a laser beam, X rays, or gamma radiation.

13. A system for producing a fine convex pattern structure having a flat portion and a fine convex pattern projecting from the flat portion in a predetermined direction with respect to the flat portion,
the system comprising:
an inclined pattern formation unit that uses an imprint mold having a fine concave pattern corresponding to the fine convex pattern, and forms a fine convex pattern projecting from the flat portion under a condition in which the fine convex pattern is inclined to the flat portion side from the predetermined direction; and
an electric charge imparting unit that causes the fine convex pattern to project in the predetermined direction with respect to the flat portion by inducing electric charges at least on the inclined fine convex pattern.

14. A system for producing a fine convex pattern structure that has a flat portion and a fine convex pattern projecting from the flat portion in a predetermined direction with respect to the flat portion, with at least the fine convex pattern being constituted by a resin material that can be shrunk by energy from outside, the system comprising:

an inclined pattern formation unit that uses an imprint mold having a fine concave pattern corresponding to the fine convex pattern, and forms a fine convex pattern projecting from the flat portion under a condition in which the fine convex pattern is inclined to the flat portion side from the position of the predetermined direction; and an energy imparting unit that causes the fine convex pattern to project in the predetermined direction with respect to the flat portion by imparting energy from outside to a relatively extended side surface, from among side surfaces of the inclined fine convex pattern formed by the inclined pattern formation unit.

\* \* \* \* \*